(12) United States Patent
Epple

(10) Patent No.: US 8,390,784 B2
(45) Date of Patent: Mar. 5, 2013

(54) CATADIOPTRIC PROJECTION OBJECTIVE WITH PUPIL MIRROR, PROJECTION EXPOSURE APPARATUS AND PROJECTION EXPOSURE METHOD

(75) Inventor: Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 773 days.

(21) Appl. No.: 12/369,460

(22) Filed: Feb. 11, 2009

(65) Prior Publication Data

US 2009/0185153 A1 Jul. 23, 2009

Related U.S. Application Data

(63) Continuation of application No. PCT/EP2007/007093, filed on Aug. 10, 2007.

(60) Provisional application No. 60/837,317, filed on Aug. 14, 2006.

(30) Foreign Application Priority Data

Aug. 14, 2006 (EP) .................................... 06016914

(51) Int. Cl.
*G03B 27/54* (2006.01)

(52) U.S. Cl. .......................................... 355/67; 359/649

(58) Field of Classification Search ................ 355/67; 359/649
See application file for complete search history.

(56) References Cited

U.S. PATENT DOCUMENTS

| | | | |
|---|---|---|---|
| 5,636,066 A | 6/1997 | Takahashi et al. | |
| 5,986,795 A | 11/1999 | Chapman et al. | |
| 6,169,627 B1 | 1/2001 | Schuster | |
| 6,252,647 B1 | 6/2001 | Shiraishi | |
| 6,426,506 B1 | 7/2002 | Hudyma | |
| 6,600,608 B1 | 7/2003 | Shafer et al. | |
| 6,770,894 B1* | 8/2004 | Schultz | 250/492.2 |
| 6,784,977 B2 | 8/2004 | Von Bünau et al. | |
| 6,842,294 B2* | 1/2005 | Holderer et al. | 359/649 |
| 6,995,833 B2 | 2/2006 | Kato et al. | |
| 2001/0043391 A1 | 11/2001 | Shafer et al. | |
| 2002/0001088 A1 | 1/2002 | Wegmann et al. | |
| 2003/0197922 A1 | 10/2003 | Hudyma | |
| 2004/0144915 A1* | 7/2004 | Wagner et al. | 250/216 |
| 2004/0232354 A1* | 11/2004 | Singer et al. | 250/492.2 |

(Continued)

FOREIGN PATENT DOCUMENTS

| | | |
|---|---|---|
| DE | 101 20 446 | 11/2002 |
| EP | 1 069 448 | 3/2003 |

(Continued)

OTHER PUBLICATIONS

Japanese Office Action, with English translation, for corresponding JP Appl No. 2009-524108, dated Sep. 24, 2012.

*Primary Examiner* — Glen Kao

(74) *Attorney, Agent, or Firm* — Fish & Richardson P.C.

(57) ABSTRACT

In certain aspects, catadioptric projection objectives for imaging a pattern from an object field arranged in an object surface of the projection objective onto an image field arranged in an image surface of the projection objective include a first objective part configured to image the pattern from the object surface into a first intermediate image, and having a first pupil surface, a second objective part configured to image the first intermediate image into a second intermediate image, and having a second pupil surface optically conjugate to the first pupil surface, and a third objective part configured to image the second intermediate image into the image surface, and having a third pupil surface optically conjugate to the first and second pupil surface. A pupil mirror having a reflective pupil mirror surface is positioned at or close to one of the first, second and third pupil surface. A pupil mirror manipulator operatively connected to the pupil mirror and configured to vary the shape of the reflective surface of the pupil mirror allows for dynamically correcting imaging aberrations originating from lens heating, compaction and other radiation induced imaging aberrations occurring during operation of the projection objective.

63 Claims, 10 Drawing Sheets

U.S. PATENT DOCUMENTS

| | | | |
|---|---|---|---|
| 2005/0117224 A1* | 6/2005 | Shafer et al. | 359/649 |
| 2005/0190435 A1* | 9/2005 | Shafer et al. | 359/365 |
| 2006/0005026 A1 | 1/2006 | Song et al. | |
| 2006/0018045 A1 | 1/2006 | Moeller et al. | |
| 2006/0023179 A1* | 2/2006 | Tschischgale et al. | 355/53 |
| 2006/0039669 A1 | 2/2006 | Katsunuma | |
| 2006/0056064 A1* | 3/2006 | Shafer et al. | 359/727 |
| 2006/0114437 A1 | 6/2006 | Akhssay et al. | |
| 2007/0036494 A1* | 2/2007 | Fischer | 385/90 |

FOREIGN PATENT DOCUMENTS

| | | |
|---|---|---|
| EP | 1 336 887 | 8/2003 |
| JP | 2005-019628 | 1/2005 |
| JP | 2005-037896 | 2/2005 |
| WO | WO 01/51979 | 7/2001 |
| WO | WO 03/093903 | 11/2003 |
| WO | WO 2004/019128 | 3/2004 |
| WO | WO 2004090600 A2 * | 10/2004 |
| WO | WO 2005/040890 | 5/2005 |
| WO | WO 2005/059654 | 6/2005 |
| WO | WO 2005091077 A2 * | 9/2005 |
| WO | WO 2005/098504 | 10/2005 |
| WO | WO 2005/098505 | 10/2005 |
| WO | WO 2005/098506 | 10/2005 |
| WO | WO 2005/111689 | 11/2005 |

* cited by examiner

CATADIOPTRIC PROJECTION OBJECTIVE WITH PUPIL MIRROR, PROJECTION EXPOSURE APPARATUS AND PROJECTION EXPOSURE METHOD

CROSS-REFERENCE TO RELATED APPLICATIONS

This application is a continuation of International Application PCT/EP2007/007093, filed on Aug. 10, 2007, which claims priority to Provisional Patent Application No. 60/837,317 and to European Patent Application No. 06016914.1, both filed on Aug. 14, 2006. The entire contents of International Application PCT/EP2007/007093, Provisional Patent Application No. 60/837,317, and European Patent Application No. 06016914.1 are incorporated herein by reference.

BACKGROUND

The disclosure relates to a catadioptric projection objective for imaging an object field arranged in an object surface of the projection objective onto an image field arranged in an image surface of the projection objective.

Catadioptric projection objectives are, for example, employed in projection exposure systems, in particular wafer scanners or wafer steppers, used for fabricating semiconductor devices and other types of microdevices and serve to project patterns on photomasks or reticles, hereinafter referred to generically as "masks" or "reticles," onto an object having a photosensitive coating with ultrahigh resolution on a reduced scale.

In order to create even finer structures, it is sought to both increase the image-side numerical aperture (NA) of the projection objective and employ shorter wavelengths, preferably ultraviolet light with wavelengths less than about 260 nm. However, there are very few materials, in particular, synthetic quartz glass and crystalline fluorides, which are sufficiently transparent in that wavelength region available for fabricating the optical elements. Since the Abbe numbers of those materials that are available lie rather close to one another, it is difficult to provide purely refractive systems that are sufficiently well color-corrected (corrected for chromatic aberrations).

In optical lithography, high resolution and good correction status have to be obtained for a relatively large, virtually planar image field. It has been pointed out that a difficult requirement that one can ask of any optical design is that it have a flat image, especially if it is an all-refractive design. In general, providing a flat image requires opposing lens powers and that leads to stronger lenses, more system length, larger system glass mass, and larger higher-order image aberrations that result from the stronger lens curvatures.

Concave mirrors have been used for some time to help solve problems of color correction and image flattening. A concave mirror has positive power, like a positive lens, but the opposite sign of Petzval curvature. Also, in general, concave mirrors do not introduce color problems. Therefore, catadioptric systems that combine refracting and reflecting elements, particularly lenses and at least one concave mirror, are primarily employed for configuring high-resolution projection objectives of the aforementioned type.

Unfortunately, a concave mirror can be difficult to integrate into an optical design, since it sends the radiation right back in the direction it came from. Intelligent designs integrating concave mirrors without causing mechanical problems or problems due to beam vignetting or pupil obscuration are desirable.

Due to the increasing demands on the efficiency of the lithographic manufacturing process there is a tendency to increase the power of the light sources. Also, progressively shorter wavelengths are used. Specific illumination settings are employed to optimize the imaging conditions for various pattern types. As a result, various time-dependent changes in the properties of optical materials within the projection system are observed, which sensibly affect the imaging quality of the exposure system. The heating of lens groups and other transparent optical elements ("lens heating") during operation due to an increased absorption is one effect dynamically influencing the imaging properties. Also, long-term (quasi-static) effects due to radiation induced refractive index variations, such as compaction effects, are often observed.

Applicant's patent application US 2004/0144915 A1 demonstrates an approach to solve some problems caused by absorption induced heating effects in a catadioptric projection objective having a physical beam splitter. The application discloses a folded catadioptric projection objective designed as a single imaging system (without intermediate image), where a concave mirror is positioned at the pupil surface. A physical beam splitter with a polarization-selective beam splitter surface is provided to separate radiation coming from the on-axis object field towards the concave mirror from radiation reflected by the concave mirror towards the image surface. The concave mirror is constructed as a deformable mirror, where the shape of the concave mirror surface can be manipulated using a pupil mirror manipulator in a manner allowing to compensate certain time-dependent imaging aberrations evolving during operation of the projection objective in response to radiation induced changes of the optical performance. The pupil mirror manipulator has simple construction and is installed at the back side of the concave mirror without interfering with the optical path. The deformable pupil mirror is designed to compensate, e.g., for astigmatism, two-fold or four-fold wavefront deformations due to absorption-induced heating of the cubic beam splitter and rectangular retardation plates, and for compaction effects and the like.

SUMMARY

In one aspect, the disclosure features catadioptric projection objectives for microlithography suitable for use in the vacuum ultraviolet (VUV) range having potential for very high image-side numerical aperture and, where a long-term stability of performance can be maintained in operation.

In a further aspect, the disclosure features projection objectives and exposure apparatus configured to be operated at stable operation conditions at various illumination settings including non-conventional off-axis illumination, such as dipole and quadrupole illumination.

In another aspect, the disclosure features catadioptric projection objectives that provide stable optical performance for immersion lithography.

In a further aspect, the disclosure features catadioptric projection objectives for microlithography applications at wavelength down to 193 nm which may be manufactured at reasonable cost and has stability of optical performance under various illumination conditions in dry lithography or immersion lithography.

In general, in one aspect, the disclosure features catadioptric projection objectives for imaging a pattern from an object field arranged in an object surface of the projection objective onto an image field arranged in an image surface of the projection objective including:

a first objective part configured to image the pattern from the object surface into a first intermediate image, and having a first pupil surface;

a second objective part configured to image the first intermediate image into a second intermediate image, and having a second pupil surface optically conjugate to the first pupil surface;

a third objective part configured to image the second intermediate image into the image surface, and having a third pupil surface optically conjugate to the first and second pupil surface;

a pupil mirror having a reflective pupil mirror surface positioned at or close to one of the first, second and third pupil surface; and a pupil mirror manipulator operatively connected to the pupil mirror and configured to vary the shape of the pupil mirror surface.

The various time-dependent radiation-induced changes in the properties of optical materials within the projection system (lens heating, compaction etc.) mentioned in the outset of this application induce characteristic imaging aberrations which are difficult to compensate with conventional manipulators, since the major contribution to imaging aberrations are field-constant contributions to non-spherical aberrations. More specifically, astigmatism on the axis (AIDA) and four-fold radial symmetric errors ("four-waviness") constant over the field are observed. Providing a pupil mirror having a pupil mirror surface and manipulating means allowing to vary the shape of that reflecting pupil mirror surface allows to compensate for these aberrations such that a wavefront essentially free of aberrations is obtained at the image surface although significant disturbances on the wavefront shape are generated within the projection objective due to lens heating, compaction and the like. The correction can generally be obtained by adjusting the shape of the reflecting pupil mirror surface such that a negative contribution of the disturbance caused by lens heating and the like is counteracted by the pupil mirror. As the pupil mirror is positioned close to or at a pupil surface of the projection objective, any deformation or variation of the shape of the reflecting surface has essentially the same effect for all field points, whereby an essentially field-constant correction is obtained.

It has been found that a catadioptric projection objective having two real intermediate images may be designed to obtain very high image-side numerical aperture in an image field large enough to allow microlithographic applications while avoiding problems such as vignetting. Further, where an off-axis object field and an image field is used, pupil obscuration can also be avoided in systems having high image-side NA. The projection objective has exactly three consecutive objective parts and exactly two intermediate images. Each of the first to third objective part is an imaging subsystem performing two consecutive Fourier-transformations (2f-system), and there is no additional objective part in addition to the first to third objective parts. Where exactly two intermediate images are provided, a large number of degrees of freedom for the optical designer is provided in optical systems which may be manufactured with reasonable size and complexity. Large image side apertures in image fields suitable for lithographic purpose are made possible.

In some embodiments, the pupil mirror has an essentially planar reflecting surface. In certain embodiments, the pupil mirror is designed as an optical element with optical power. In some embodiments the pupil mirror is a concave mirror.

It has been found useful that at least one intermediate image is formed between the object surface and the pupil mirror, which allows to prepare the radiation appropriately prior to reflection on the pupil mirror. Where at least one imaging subsystem (objective part) is disposed between object surface and pupil mirror, the radiation impinging on the pupil mirror may be prepared effectively for optimized use of the correction capabilities of the pupil mirror.

In some embodiments the pupil mirror is arranged in the second objective part at or close to the second pupil surface. One or more lenses may be provided in addition in the second objective part to form a catadioptric second objective part. Alternatively, the second objective part may be purely reflective (catoptric).

In some embodiments, the first objective part forming the first intermediate image is purely refractive, i.e. contains only one or more lenses and no imaging mirror. Alternatively, or in addition, the third objective part, forming the final image in the image surface from the second intermediate image may be a purely refractive objective part.

Concatenated systems having, in that sequence, a first, refractive objective part (R), a second, catadioptric or catoptric objective part (C), and a refractive (R) third objective part will be denoted "R—C—R" type systems in the following.

In some embodiments, the first objective part is a catadioptric objective part, the second objective part is catadioptric or catoptric and includes the pupil mirror, and the third objective part is a refractive objective part. Those systems may be designated as "C—C—R" type systems.

The optical elements of the projection objective may be arranged in a variety of ways.

Some embodiments are designed as a "folded" catadioptric projection objective having an optical axis which is subdivided into at least two non-parallel axis segments by means of a mirror (deflecting mirror). Typically, a deflecting mirror may have a planar reflective surface, i.e. no optical power.

Some embodiments include a first deflecting mirror arranged to deflect radiation from the object surface towards the pupil mirror or to deflect radiation from the pupil mirror towards the image surface such that a double pass region is formed geometrically between the first deflecting mirror and the pupil mirror. Providing at least one deflecting mirror facilitates arranging a pupil mirror close to or at a pupil surface without unduly limiting the available numerical aperture by the size of the pupil mirror.

A second deflecting mirror arranged at a 90° angle to the first deflecting mirror may be provided such that the object surface and the image surface are parallel. The second deflecting mirror may be arranged to receive directly radiation reflected from the pupil mirror or may be arranged to receive radiation reflected from the first deflecting mirror.

In some embodiments the first deflecting mirror is arranged to deflect radiation coming from the object surface in the direction of the pupil mirror and the second folding mirror is arranged to deflect radiation coming from the pupil mirror in the direction of the image plane. This folding geometry can allow for arranging the segments of the optical axis defined by the optical elements of the first objective part and the third objective part essentially coaxial, i.e., exactly coaxial or with only a slight lateral offset, the offset being very small in relation to the typical lens diameter. Examples of projection objectives according to this general folding geometry are disclosed, for example, in WO 2004/019128 A2 or WO 2005/111689 A. The entire disclosure of these documents is incorporated herein by reference.

In some embodiments, the first deflecting mirror is arranged optically downstream of the pupil mirror to deflect radiation reflected by the pupil mirror towards the second deflecting mirror, and the second deflecting mirror is arranged to deflect radiation from the first deflecting mirror towards the image surface. In those types of embodiments an optical axis defined by a concave pupil mirror may be coaxial with the segment of the optical axis defined by the first objective part. A large lateral offset between object surface and image surface is typically obtained, the offset being large in comparison to a typical lens diameter. Objectives of this type typically include two lens barrel structures mounted parallel to each other. Typical examples are disclosed, for example in U.S. Pat. No. 6,995,833 B2. The entire disclosure of these documents is incorporated herein by reference.

A negative group including at least one negative lens may be arranged in front of a concave pupil mirror on a reflecting side thereof in a double pass region such that radiation passes at least twice in opposite directions through the negative group. The negative group may be positioned in direct proximity to the concave pupil mirror in a region near the pupil, where this region may be characterized by the fact that the marginal ray height (MRH) of the imaging is greater than the chief ray height (CRH). In some embodiments, the marginal ray height is at least twice as large, in particular at least 5 to 10 times as large, as the chief ray height in the region of the negative group. A negative group in the region of large marginal ray heights can contribute effectively to the chromatic correction, in particular to the correction of the axial chromatic aberration, since the axial chromatic aberration of a thin lens is proportional to the square of the marginal ray height at the location of the lens (and proportional to the refractive power and to the dispersion of the lens). Added to this is the fact that the projection radiation passes twice, in opposite through-radiating directions, through a negative group arranged in direct proximity to a concave mirror, with the result that the chromatically overcorrecting effect of the negative group is utilized twice. The negative group may, e.g., include only a single negative lens or contain at least two negative lenses.

In some embodiments all optical elements of the projection objective are aligned along a straight optical axis common to all optical elements of the projection objective. Optical systems of this type are denoted "in-line systems" in this application.

From an optical point of view, in-line systems can be advantageous since optical problems caused by utilizing planar folding mirrors, such as polarization effects, can be avoided. Also, from a manufacturing point of view, in-line systems may be designed such that conventional mounting techniques for optical elements can be utilized, thereby improving mechanical stability of the projection objectives. Utilizing an even number of mirrors, such as two or four or six mirrors, allows imaging without image flip.

The optical elements of an in-line system may include a mirror group having an object-side mirror group entry for receiving radiation from the object surface and an image-side mirror group exit for exiting radiation emerging from the mirror group exit towards the image surface, wherein the mirror group includes the at least one pupil mirror.

Where an on-axis field (object field and image field centered about the optical axis) is desired, the mirror group may be formed by a pair of concave mirrors having their concave reflecting surfaces facing each other, where a transparent portion (such as a hole or bore) is manufactured in the mirror surfaces in the region around the optical axis to allow radiation to pass through the mirrors. The concave mirrors may be arranged optically close to a pupil surface. At least one of the concave mirrors may be provided with a pupil mirror manipulator to form a deformable pupil mirror. Examples of systems with two intermediate images, on-axis field and pupil obscuration are disclosed for example in applicants U.S. Pat. No. 6,600,608, the entire disclosure of which is incorporated herein by reference.

In some embodiments, such as where imaging without pupil obscuration is desired, an off-axis field (object field and image field entirely outside of the optical axis) may be used.

In-line systems typically have very little installation space for positioning the mirrors. Also, the size of mirrors at a pupil surface limits the capabilities to image a reasonably sized rectangular or arc-shaped "effective image field" at large image-side numerical apertures. This corresponds to relatively low values of the "effective etendue" (effective geometrical flux) of the object field, i.e. the distance between the innermost field point which can be imaged without vignetting and the outer edge of the effective object field is small. Under these conditions, the size of the "design object field", i.e., the field for which the projection objective should be sufficiently corrected, will become relatively large if reasonably sized effective object fields having rectangular or arcuate shape are desired. As the number and sizes of optical elements typically increase drastically if the size of the design object field is to be increased, it is generally desirable to keep the design object field as small as possible. (For detailed definitions of the terms "effective object field", "effective etendue" of "design object field" and the interrelations therebetween see applicant's international patent application WO 2005/098506 A1, the entire disclosure of which is incorporated herein by reference)

At least for these considerations it has been found useful that the mirror group includes:
a first mirror for receiving radiation from the mirror group entry on the first reflecting area;
a second mirror for receiving radiation reflected from the first mirror on a second reflecting area;
a third mirror for receiving radiation reflected from the second mirror on a third reflecting area; and
a fourth mirror for receiving radiation reflected from the third mirror and for reflecting the radiation to the mirror group exit;
wherein at least two of the mirrors are concave mirrors having a surface of curvature rotationally symmetric to the optical axis.

Providing at least four mirrors in the mirror group allows to limit the size of the pupil mirror even if the image-side numerical aperture is increased, whereby vignetting control is facilitated. In some embodiments, exactly four mirrors are provided. All mirrors of the mirror group may be concave mirrors.

Although it is possible to utilize the second mirror (geometrically closer to the object surface) as the pupil mirror, is has been found useful in many cases if the third mirror is constructed as the pupil mirror. The third mirror is typically geometrically remote from the object surface on the image-side of the mirror group, thereby allowing geometrical space for guiding radiation appropriately towards the third mirror. Also, the optical elements optically upstream of the third mirror and including the first and the second mirror may be utilized to shape and prepare the radiation beam appropriately for the pupil mirror. For example, correction status and chief ray height may be influenced as needed.

In some embodiments, the mirrors of the mirror group are arranged such that radiation coming from the mirror group entry passes at least five times through a mirror group plane defined transversely to the optical axis and arranged geometrically between the mirror group entry and the mirror group exit prior to exiting the mirror group at the mirror group exit. A multitude of at least four reflections can thereby be obtained within an axially compact space defined between the mirror group entry and the mirror group exit.

A front lens group may be arranged between the object surface and the mirror group entry, thereby allowing to transform the spatial distribution of radiation at the object surface into a desired angular distribution of radiation at the mirror group entry and to adjust the angles of incidence with which the radiation enters the mirror group and impinges on the first mirror. The design of the front lens group may be selected such that the radiation beam entering the mirror group entry has a desired cross-sectional shape allowing to pass the radiation beam into the mirror group entry without hitting adjacent mirror edges, thereby avoiding vignetting of the beam. The front lens group may be designed as a Fourier lens group, i.e., a single optical element or a group consisting of at least two optical elements which perform one single Fourier transformation or an odd number of consecutive Fourier transformations between a front focal plane and a rear focal plane of the Fourier lens group. In some embodiments a Fourier lens group forming the front lens group is purely refractive and performs a single Fourier transformation. In certain embodiments the Fourier lens group is configured to image the entrance pupil of the projection objective essentially at a position of the mirror group entry such that there is a pupil surface at or next to the mirror group entry. Embodiments without front lens group are possible.

Catadioptric in-line systems having a compact four-mirror mirror group are disclosed in Applicant's international patent application WO 2005/098505 A1, the entire disclosure of which is incorporated herein by reference. Some embodiments include a pupil mirror and may be used, with appropriate modifications, in connection with the present disclosure.

In some embodiments the first objective part (forming an intermediate image upstream of the pupil mirror) is designed as an enlarging imaging system having magnification ratio $|\beta|>1$, thereby forming a first intermediate image which is larger than the effective object field. In certain embodiments, the condition $|\beta|>1.5$ holds. An enlarged intermediate image may be utilized to obtain large chief ray angles $CRA_{PM}$ at the pupil mirror downstream thereof. Considering that the product of the paraxial chief ray angle CRA and the size of a pupil is constant in an optical imaging system (Lagrange invariant), large chief ray angles at the pupil surface correspond to a small pupil, i.e., to small beam diameters of the beam at the pupil surface.

In some embodiments, the pupil mirror is arranged optically between a first mirror upstream of the pupil mirror and a second mirror downstream of the pupil mirror, where a chief ray height is $CRH_O$ in the object surface, $CRH_1$ at the first mirror and $CRH_2$ at the second mirror, where the conditions $CRH_1>CRH_O$ and $CRH_2>CRH_O$ are fulfilled. In certain embodiments, at least one of the conditions $CRH_1>1.5\times CRH_O$ and $CRH_2>CRH_O$ is fulfilled. With other words, the ray heights of the chief ray at mirrors immediately upstream and immediately downstream of the pupil mirror are larger than the object height. A ratio between the chief ray height $CRH_O$ in the object surface and the chief ray height at least one of the mirrors optically upstream or downstream of the pupil mirror may be at least 1.5 or at least 2.0 or at least 2.5, for example. Under these conditions, a small beam diameter is obtained at the pupil mirror, which allows to have a pupil mirror with small size.

In some embodiments the optical elements arranged between the object surface and the pupil mirror are configured to provide a maximum chief ray angle $CRA_{max}>25°$ at the pupil mirror. Maximum chief ray angles larger than 30° or larger than 35° or even larger than 40° are possible in some embodiments. A small pupil allows use of a pupil mirror having small diameter. This, in turn, can allow guiding radiation past the pupil mirror even if the aperture of radiation in the projection beam is large. Therefore, large chief ray angles at the pupil mirror can facilitate obtaining high image-side numerical apertures in catadioptric in-line systems.

The optically utilized free diameter $D_{PM}$ of the pupil mirror may be exceptionally small. In some embodiments, the pupil mirror is the optical element with the smallest diameter within the entire projection objective. The pupil mirror diameter $D_{PM}$ may be less than 50% or less than 40% or less than 30% of the maximum free diameter at an optical element within the projection objective.

The projection objective may have an aperture stop allowing to adjust the diameter of the aperture as desired, where a maximum diameter of the aperture of the aperture stop is at least twice as large as the diameter $D_{PM}$ of the pupil mirror.

If a deformation of the pupil mirror surface is intended to effect a correction which is essentially the same for all field points (this is denoted here as: "field-constant" correction) particular emphasis should be placed on the correction status of the projection beam incident on the pupil mirror. In some embodiments the projection beam at the pupil mirror surface obeys the conditions:

$$|CRH_i|/D_0<0.1 \quad (1)$$

$$0.9 \leq D_i/D_0 \leq 1.1 \quad (2)$$

where $|CRH_i|$ is the amount of a chief ray height of a chief ray of an object field point i at the pupil mirror surface;

$D_0$ is twice the amount of the marginal ray height at the pupil mirror surface; and $D_i=|HRRU_i-HRRL_i|$ is the diameter in the meridional direction of the image of the entrance pupil of the projection objective at the pupil mirror surface for a field point i, where $HRR_i$ is the rim ray height of the upper rim ray and $HRRL_i$ is the rim ray height of the lower rim ray corresponding to field point i.

The chief ray is the ray from the outermost field point to the center of the entrance pupil. If the above conditions (1) and (2) are fulfilled, an image of the entrance pupil is positioned very close to or at the pupil mirror, which allows to obtain field-constant corrections in response to deformations of the pupil mirror.

In some embodiments, for example where an axially compact design is desired, the pupil mirror and another mirror having the same general orientation of the respective reflecting surface are arranged geometrically close to each other. In some embodiments this problem is solved by providing a mirror pair consisting of two concave mirrors having mirror surfaces sharing a common surface of curvature provided on a common substrate, wherein one of the concave mirrors is the pupil mirror having a reflecting pupil mirror surface configured to be deformable by a pupil mirror manipulator and the other concave mirror has a rigid refractive surface separate from the pupil mirror surface. This combination of mirrors may be provided in one common mounting structure, thereby facilitating mounting of the pupil mirror.

In some embodiments the pupil mirror is arranged at or close to one of the pupil surfaces and one or more transparent optical elements are arranged at or close to at least one of the optically conjugate pupil surfaces. Generally, a position "at or near to" a pupil surface may be characterized here as a position where the marginal ray height MRH is greater than the chief ray height CRH such that a ray height ratio RHR=MRH/CRH>1. Absorption-induced deformations and refractive index variations caused in these lens elements (close to a conjugated pupil surface) may cause wavefront aberrations, which may be compensated for in a targeted fashion by appropriately deforming the pupil mirror surface. For example, if a polar illumination setting, such as dipole illumination or quadrupole illumination is used, an inhomogeneous radiation load having two-fold or four-fold radial symmetry, respectively, may result in transparent optical elements close to pupil surfaces. Resulting wavefront deformations, which may have two-fold or four-fold radial symmetry, may be at least partly compensated for by corresponding deformations of the pupil mirror surface by causing the pupil mirror surface to deform essentially with a two-fold or four-fold radial symmetry.

The capability of compensation provided by manipulations at the pupil mirror may be particularly useful in optical systems using optical materials which, by the nature of the optical materials used, may be particularly sensitive to uneven (non-uniform) absorption-induced heating effects. For example, it may be desired to use fused silica (synthetic quartz glass) to manufacture some or all of the lenses of the projection objective. Fused silica is available in high optical quality and in amounts and sizes large enough to manufacture large lenses, such as required in high NA microlithographic projection objectives. Further, processing fused silica to obtain high quality optical surfaces is well established. Further, fused silica has virtually no absorption down to wavelength in the order of about 190 nm. Therefore, it may be desirable to use high amounts of fused silica for the lenses of the objective. On the other hand, the specific heat conductance of fused silica is smaller than the specific heat conductance of calcium fluoride ($CaF_2$) and other alkaline fluoride crystal materials which are used at smaller wavelength, such as 157 nm, due to the very low absorption even at these small wavelength. As the specific heat conductance of calcium fluoride is greater than that of fused silica, the negative effects of uneven heating by projection radiation may be smaller in calcium fluoride compared to fused silica since local temperature gradients caused by uneven heating may balance faster and more efficient in materials with relatively high specific heat conductance, thereby making systems made of those materials less susceptible to problems caused by uneven lens heating. Providing a pupil mirror capable of being manipulated to compensate lens heating effects allows to use fused silica, for example, even at positions close to or at conjugate pupil surfaces where uneven heating of the lens material is likely to occur under certain illumination conditions (e.g. dipole illumination or quadrupole illumination) and/or upon use of certain structures of the patterns to be imaged.

In some embodiments optical elements at or close to an optically conjugate pupil surface are made of an optical material that has a specific heat conductance smaller than the specific heat conductance of calcium fluoride. Optical elements at or close to conjugate pupil surfaces may be made from fused silica, for example.

In some embodiments, at least 90% of all lenses of the projection objective are made from fused silica. In some embodiments, all lenses are made from fused silica.

Embodiments may have an image-side numerical aperture NA≧0.6, for example, thereby allowing use in microlithography to obtain small feature sizes in a microlithographic exposure process. Embodiments with NA≧0.7 are possible. In some embodiments the catadioptric projection objective has an image-side numerical aperture NA≧0.8 or even NA≧0.9, which is close to the theoretical limit for "dry systems" i.e. projection objectives adapted with regard to imaging aberrations to a dry process where the image space between the exit surface of the projection objective and the image surface (where the substrate is arranged) is filled with a gas having refractive index close to 1.

In certain embodiments the catadioptric projection objective is designed as an immersion objective adapted with regard to imaging aberrations to a wet process where the image space between the exit surface of the projection objective and the image surface is filled with an immersion medium having refractive index significantly larger than 1. For example, the refractive index may be 1.3 or more, or 1.4 or more, or 1.5 or more. The projection objective may have an image-side numerical aperture NA>1.0 when used in connection with an immersion medium, e.g. having refractive index $n_I$>1.3, for example NA≧1.1 or NA≧1.2 or NA≧1.3. Alternatively, the projection objective may have an image-side numerical aperture NA<1.0 when used in connection with an immersion medium.

In general, the image-side numerical aperture NA is limited by the refractive index of the surrounding medium in image space. In immersion lithography the theoretically possible numerical aperture NA is limited by the refractive index of the immersion medium. The immersion medium can be a liquid (liquid immersion, "wet process") or a solid (solid immersion).

For practical reasons the aperture should generally not come arbitrarily close to the reflective index of the last medium, i.e. the medium closest to the image, since the propagation angles then become very large relative to the optical axis. Empirically, the image-side NA may approach about 95% of the refractive index of the last medium on the image side. For immersion lithography at λ=193 nm, this corresponds to a numerical aperture of NA=1.35 in the case of water ($n_{H2O}$=1.43) as immersion medium.

Some embodiments are configured to allow extending the range of image-side NA to values NA=1.35 and above. In some embodiments at least one optical element is a high-index optical element made from a high-index material with the refractive index n≧1.6 at the operating wavelength. The refractive index may be about 1.7 or more or 1.8 or more or even 1.9 or more at the operating wavelength. The operating wavelength may be in the deep ultraviolet (DUV) regime below 260 nm, such as 248 nm or 193 nm.

The projection objective has a last optical element closest to the image surface. The exit side of the last optical element immediately adjacent to the image surface forms the exit surface of the projection objective. The exit surface may be planar or curved, for example concave. In some embodiments the last optical element is at least partly made of a high-index material with refractive index n>1.6 at the operating wavelength. For example, the last optical element may be a monolithic plano-convex lens having a spherically or aspherically curved entry surface, and a planar exit surface immediately adjacent to the image surface.

The high-index material may be sapphire ($Al_2O_3$), for example, which may be used as high-index material down to about λ=193 nm. In some embodiments, the high-index material is lutetium aluminum garnet (LuAG) having a refractive index n=2.14 at λ=193 nm. The high-index material may be barium fluoride ($BaF_2$), lithium fluoride (LiF) or barium lithium fluoride ($BaLiF_3$). Immersion liquids with refractive index higher than that of pure water may be used, for example water doped with index increasing additives, or cyclohexane with $n_I$=1.65 at 193 nm. In some embodiments for λ=193 nm an image-side numerical aperture NA>1.4 and NA>1.5 may be obtained, such as NA=1.55. Use of high-index materials in catadioptric projection objective for immersion lithography is disclosed, for example, in applicant's U.S. patent application Ser. No. 11/151,465. The disclosure of this document regarding use of high-index material is incorporated herein by reference.

In certain aspects, disclosed embodiments enable providing catadioptric projection objectives with moderate dimensions allowing immersion lithography, particularly at image-side numerical apertures NA>1. The imaging characteristics of the projection objective may be dynamically modified during the lifetime of the projection objective by adjusting the shape of the reflecting pupil mirror surface. Where certain conditions regarding the correction status of the projection beam at the pupil mirror are observed, a correcting effect essentially constant (little or no variation) across the field (field-constant correction) may be obtained. In an immersion system these capabilities may be used to compensate for imaging aberrations caused by time-dependent changes of the optical properties of the immersion liquid, which may, for example, be caused by temperature changes during operation. For example, a field-constant contribution to spherical aberration caused by a temperature drift of the immersion layer in a substantially telecentric image at the wafer may be compensated for.

This compensation may be utilized independent of the type of projection objective (e.g. with or without intermediate image(s), in-line or folded projection objective).

According to another aspect, the disclosure also relates to a method of fabricating semiconductor devices and other types of microdevices utilizing a catadioptric projection objective that includes placing a mask providing a prescribed pattern in the object surface of the projection objective;

illuminating the mask with ultraviolet radiation having a prescribed wavelength;

arranging an immersion layer formed by an immersion liquid having a refractive index substantially larger than 1 between an exit surface of the projection objective and a substrate having a substrate surface essentially placed in the image surface of the projection objective;

projecting an image of the pattern onto the photo sensitive substrate through the immersion layer; and adjusting the imaging characteristics of the projection objective by varying a surface shape of a pupil mirror having a reflective pupil mirror surface positioned close to or at a pupil surface of the projection objective.

The adjusting step may be performed during exposure of the substrate and/or during an exchange of substrates and/or an exchange between different masks at the location of use of the projection objective and/or during a change between different illumination settings.

It has been observed that lens heating effects may be particularly pronounced if illumination settings with small degrees of coherence, such as dipole illumination or quadrupole illumination, are used. Under these conditions transparent optical elements, such as lenses positioned at or close to a pupil surface of the projection objective, may be subject to spatially inhomogeneous radiation loads leading to local maxima of a radiation intensity and local heating in the region of diffraction maxima of the imaging. This may lead to characteristic deformations and refractive index variations of lens elements, e.g. having approximately two-fold or four-fold radial symmetry depending on whether dipole illumination or quadrupole illumination is used. These deformations and refractive index variations, in turn, may cause corresponding wavefront deformations deteriorating imaging performance.

A solution to these and other problems is a method of fabricating semiconductor devices and other types of microdevices utilizing a catadioptric projection objective comprising:

placing a mask providing a prescribed pattern in the object surface of the projection objective;

illuminating the mask with ultraviolet radiation having a prescribed wavelength utilizing an illumination setting provided by an illumination system;

adjusting the illumination to provide an off-axis illumination setting where, in a pupil surface of the illumination system and in at least one optically conjugate pupil surface of the projection objective, a light intensity in regions outside the optical axis is greater than a light intensity at or near to the optical axis;

adjusting the imaging characteristics of the projection objective by varying a surface shape of a pupil mirror having a reflective pupil mirror surface positioned close to or at a pupil surface of the projection objective in a manner adapted to the off-axis illumination setting such that wavefront aberrations caused by spatially inhomogeneous radiation loads on optical elements at or near a pupil surface of the projection objective are at least partly compensated.

In general, the illumination setting may be set in accordance with the type of pattern provided by a mask or another patterning means. A change of illumination setting may be performed when a first reticle with a given structure is replaced by a second reticle with another structure. In exposure methods using multiple exposure, two or more different illumination settings, optionally including an off-axis illumination setting, may be used to illuminate a given structure in consecutive exposure steps. The off-axis illumination setting may be a polar illumination setting, such as a dipole illumination or a quadrupole illumination.

As some of the aberrations caused by the change of properties of an immersion layer and/or of the projection objective may be dynamic effects on a relatively short time scale it may be provided that imaging aberrations (or other properties influencing imaging aberrations) associated with time-dependent variations of optical properties of the projection system, optionally including time-dependent changes of optical properties of an immersion layer and/or changes induced by utilizing polar, off-axis illumination settings etc., are detected (or sensed) by an appropriate detector (or sensor) generating sensing signals indicative of that time-dependent changes, and the variation of the shape of the pupil mirror surface by a pupil mirror manipulator is driven in response to the sensing signals such that a deformation of the shape of the pupil mirror surface is effective to compensate at least partly the time-dependent changes. The pupil mirror manipulator is thereby integrated into a control loop allowing real-time control of imaging aberrations. Specifically, the pupil mirror manipulator may be driven such that field-constant aberration contributions caused by changes of refractive index of the immersion liquid are at least partly compensated. A more stable process of immersion lithography may thereby be obtained.

For example, imaging aberrations may be detected directly using an interferometric or other suitable direct measuring system. Indirect methods are also possible. For example, if an immersion liquid is used, a temperature sensor may be provided to monitor the temperature of the immersion liquid forming the immersion layer, and refractive index variations caused by temperature changes may be empirically derived from these measurements based on a lookup-table, and compensated for by manipulating the pupil mirror dynamically.

Alternatively, or in addition, a feed-forward control of the manipulations to obtain a desired pupil mirror shape may be utilized. For example, a control unit may receive signals indicating the type of polar illumination setting set in the illumination system, and the control unit may provide appropriate control signals to the pupil mirror manipulator based on look-up tables or the like to deform the pupil mirror surface such that wavefront deformations caused by locally inhomogeneous absorption induced heating in lenses close to or at pupil surfaces of the projection objective are at least partly compensated.

The previous and other properties can be seen not only in the claims but also in the description and the drawings, wherein individual characteristics may be used either alone or in sub-combinations as an embodiment of the disclosure and in other areas and may individually represent advantageous and patentable embodiments.

A number of references are incorporated herein by reference. In case of conflict, the present specification, including definitions, will control.

DETAILED DESCRIPTION

In the following description, the object involved is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Embodiments having a plurality of mirrors are described. Unless stated otherwise, the mirrors will be numbered according to the sequence in which the radiation is reflected on the mirrors. In other words, the numbering of the mirrors denotes the mirrors according to the position along the optical path of radiation, rather than according to geometrical position.

Where appropriate, identical or similar features or feature groups in different embodiments are denoted by similar reference identifications.

Where tables are provided to disclose the specification of a design shown in a figure, the table or tables are designated by the same numbers as the respective figures.

In some embodiments described below the surfaces of curvature of all curved mirrors have a common axis of rotational symmetry, also denoted mirror group axis. The mirror group axis coincides with the optical axis OA of the projection objective. Axially symmetric optical systems, also named coaxial systems or in-line systems, are provided this way. Object surface and image surface are parallel. An even number of reflections occurs. The effectively used object field and image field are off-axis, i.e. positioned entirely outside the optical axis. All systems have a circular pupil centered around the optical axis thus allowing use as projection objectives for microlithography.

In other embodiments the optical axis is folded into axis segments inclined at an angle relative to each other.

Figure 1:
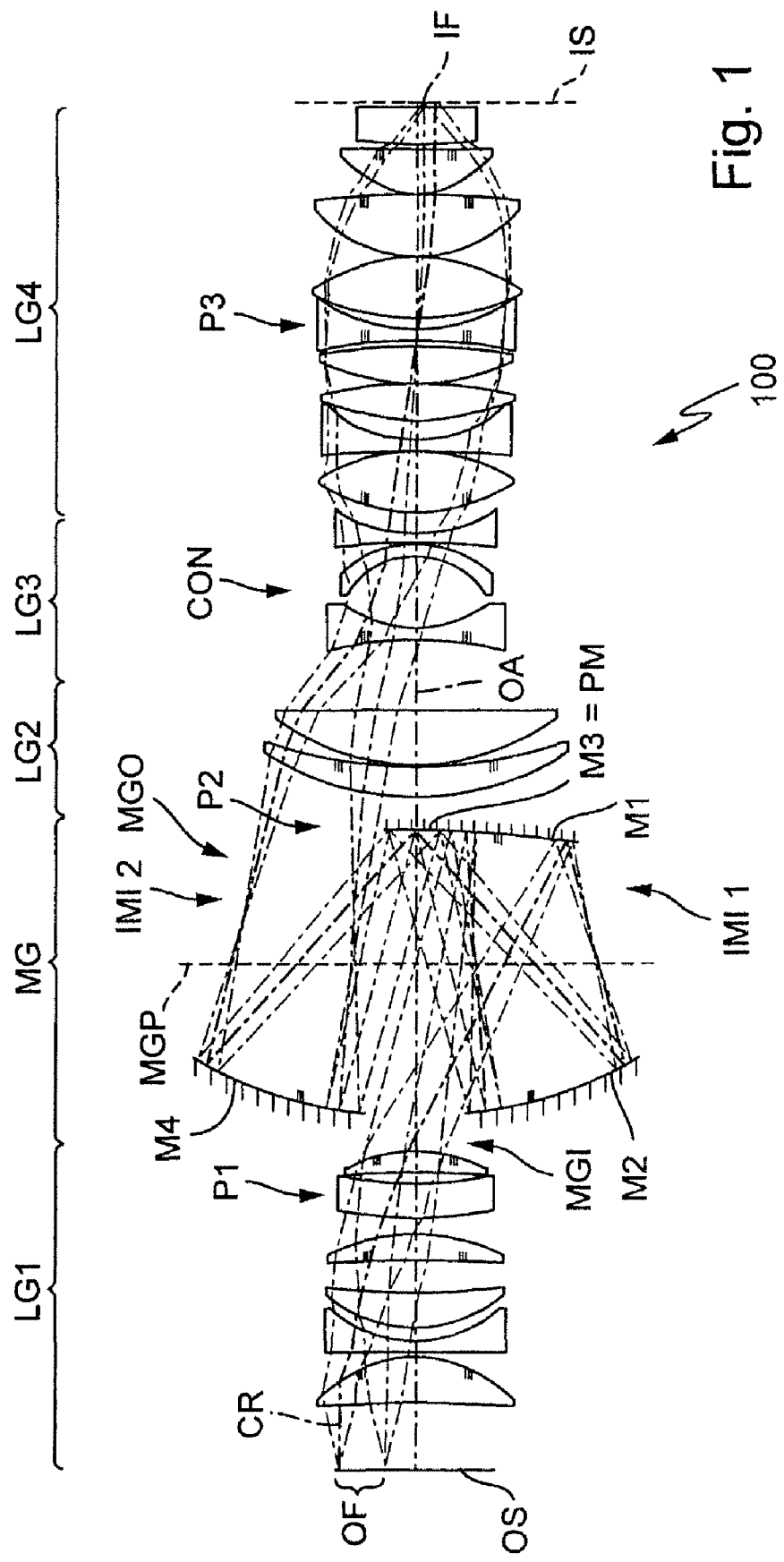
FIG. 1 shows a lens section of a first embodiment of an in-line catadioptric dry objective for microlithography at NA=0.93 having a deformable concave pupil mirror.
Figure 2:
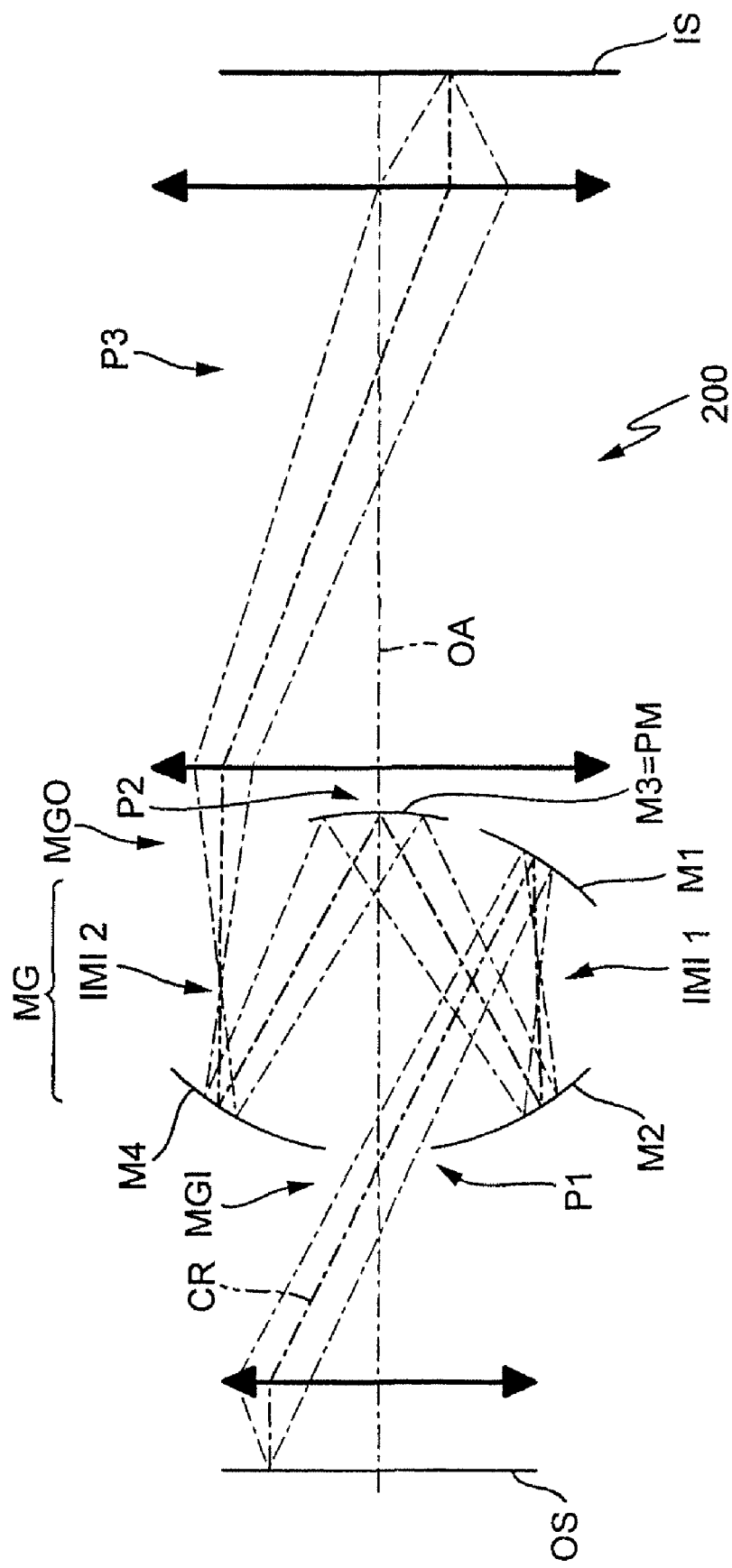
FIG. 2 shows a schematic axial section through a catadioptric in-line projection objective similar to the embodiment of FIG. 1.

FIG. 1 shows a lens section of a first embodiment of a catadioptric projection objective 100 designed to project an image of a pattern on a reticle arranged in the planar object surface OS (object plane) onto a planar image surface IS (image plane) on a reduced scale, for example 4:1, while creating exactly two real intermediate images IMI1 and IMI2. An off-axis effective object field OF positioned outside the optical axis OA is thereby projected on an off-axis image field IF. FIG. 2 shows a simplified representation of a variant of the type of projection objective shown in FIG. 1.

The path of the chief ray CR of an outer field point of the off-axis object field OF is drawn bold in FIG. 1 and FIG. 2 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Due to the rotational symmetry of the system the chief ray may be chosen from an equivalent field point in the meridional plane as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field is used. The imaging process is further characterized by the trajectory of "rim rays". A "rim ray" as used herein is a ray running from an off-axis object field point (field point at a distance from the optical axis) to the edge of an aperture stop. The term "upper rim ray" refers to a rim ray having an increasing distance to the optical axis in propagation direction, i.e. running away from the optical axis near the object surface. The term "lower rim ray", in contrast, refers to a rim ray having a decreasing distance to the optical axis in propagation direction, i.e. running towards the optical axis near the object surface. The chief ray and marginal ray and rim rays are chosen to characterize optical properties of the projection objectives (see also description related to FIG. 4). The angles included between such selected rays and the optical axis at a given axial position are denoted as "chief ray angle", "marginal ray angle" etc. The radial distance between such selected rays and the optical axis at a given axial position are denoted as "chief ray height", "marginal ray height" etc.

The projection objective 100 may be subdivided into five groups of optical elements aligned along a straight (unfolded) common optical axis OA, namely a first lens group LG1 immediately following the object surface and having positive refractive power, a mirror group MG immediately following the first lens group and having overall positive power, a second lens group LG2 with positive refractive power immediately following the mirror group, a third lens group LG3 immediately following the second lens group having negative refractive power, and a fourth lens group LG4 immediately following the third lens group and having positive refractive power. The lens groups LG1 to LG4 are purely refractive, whereas the mirror group MG is purely reflective (only reflecting surfaces).

The first lens group LG1 (also denoted front lens group) is designed to image the telecentric entrance pupil of the projection objective with strong positive power into a first pupil surface P1, thereby acting in the manner of a Fourier lens group performing a single Fourier transformation. This Fourier transformation leads to a relatively large chief ray angle $CRA_{P1}$ in the order of 28° at the first pupil surface P1. As a consequence, the diameter of the pupil in the first pupil surface is relatively small.

Radiation emerging from the first pupil surface P1 is incident on first mirror M1 having an aspheric, concave mirror surface facing the object-side and forms the first intermediate image IMI1 optically downstream of and at a distance from the first mirror M1. Radiation is then reflected on the second mirror M2 designed as an aspherical concave mirror and reflected at an oblique angle towards the third mirror M3 having a reflective surface including the optical axis OA. The concave mirror surface of the third mirror is positioned in a second pupil surface P2 where the chief ray intersects the optical axis, thereby forming a pupil mirror PM. As a very large chief ray angle $CRA_{PM} \approx 42°$ is created at the second pupil surface, a small size of the second pupil is obtained (Lagrange invariant). Radiation reflected from third mirror M3 (pupil mirror PM) at a large chief ray angle is captured upon reflection on the aspheric image-side concave mirror surface of fourth mirror M4 having optical power designed to converge the radiation beam towards the second intermediate image IMI2 immediately downstream of and at a distance from the fourth mirror M4.

It is possible to modify the optical design such that mirror surfaces do not have an aspherical shape, but a spherical shape instead. For example, the second and fourth mirrors M2 and M4 may be realized as spherical mirrors. It is furthermore possible to construct second mirror M2 and fourth mirror M4 as separate mirrors with different surface figures (surface shapes), and/or to realize first and third mirrors M1 and M3 as separate mirrors with different surface figures. In that case, at least one of the individual mirrors may be realized as spherical mirrors instead of aspherical mirror.

It is evident that the chief ray height at the object surface OS (also denoted object height) is considerably smaller than the chief ray height at the second mirror M2 immediately upstream of the pupil mirror M3 and also substantially smaller than the corresponding chief ray height at fourth mirror M4 immediately downstream of the pupil mirror. In some embodiments, the ratio between the chief ray height $CRH_O$ at the object surface and the chief ray heights $CRH_M$ at mirrors immediately upstream and downstream of the pupil surface is substantially larger than 1, for example larger than 2 or larger than 2.5. In the embodiment of FIG. 1, this ratio is about 2.7 for both mirrors M2 and M4.

Radiation enters the mirror group at a mirror group entry MGI close to first pupil P1 and exits the mirror group at mirror group exit MGO positioned near the second intermediate image, i.e. near to a field surface. A mirror group plane MGP aligned perpendicular to the optical axis and positioned between the vertices of the first and the second mirror of the mirror group is passed five times prior to the beam exiting the mirror group at the mirror group exit. Therefore, four reflections can be obtained within an axially compact space defined between the mirror group entry and the mirror group exit.

The second intermediate image IMI2, enlarged with respect to the effective object field OF, is imaged onto the image surface IS by a purely refractive objective part (also denoted as rear lens group) consisting of the second lens group LG2, the third lens group LG3 and the fourth lens group LG4. A constriction CON of the projection beam indicated by a local minimum of beam diameter is formed in the region of the negative lenses in the third lens group LG3. The second lens group LG2 has positive refractive power and acts essentially as a field lens group imaging the exit pupil of the fourth mirror M4 closer to the catoptric mirror group. This allows to design the subsequent lenses with relative small optically free diameters on a short overall axial length. The third lens group LG3 has negative refractive power thereby forming the constriction or "waist" of the beam diameter. Providing this negative lens group allows to increase the numerical aperture after the second intermediate image IMI2. The third lens group LG3 together with the subsequent part of the fourth lens group LG4 between the third lens group and the third pupil surface P3 form a reversed telesystem having a compact axial length despite of the required minimum diameter of the system aperture at small numerical aperture of the second intermediate image IMI2.

In an alternative description the optical elements of the projection objective 100 form a first imaging objective part including the lenses of first lens group LG1 and the first mirror M1 for imaging the pattern provided in the object field region of the mask into the first intermediate image IMI1, a second imaging objective part including the pupil mirror PM for imaging the first intermediate image into the second intermediate image IMI2, and third imaging objective part for imaging the second intermediate image into the image surface IS. The first objective part is catadioptric (having six lenses in LG1 and one concave mirror M1), the second objective part is purely reflective (catoptric) and formed by concave mirrors M2, M3 and M4, and the third objective part formed by LG2, LG3 and LG4 is purely refractive. The first, catadioptric objective part with enlarging magnification ratio ($|\beta|=2.1$) defines the size of the first intermediate image IMI1 and cooperates with the second mirror M2 to define the correction status of the projection beam at the pupil mirror PM. The absolute values of the chief ray height at the mirrors M2 immediately upstream and M4 immediately downstream of the pupil mirror are significantly larger than the chief ray height at the object surface, which is another expression of conditions favouring a small pupil size at the pupil mirror. The large chief ray angles responsible for the small size of the pupil at pupil mirror PM are captured by fourth mirror M4 to form a beam converging towards the second intermediate image and the image-side refractive lens groups LG2, LG3 and LG4. This part (rear lens group) is optimized for controlling the imaging aberrations and to provide the large image-side numerical aperture NA=0.93.

The purely reflective (catoptric) mirror group MG is capable to provide strong overcorrection of the Petzval sum counteracting opposite effects of positive refractive power of lenses upstream and downstream of the mirror group. To that end, the mirror group MG consists of a first concave mirror M1 placed on the side of the optical axis opposite to the object field OF, the second concave mirror M2 placed on the same side of the optical axis, the third concave mirror M3 placed on the optical axis to act as a pupil mirror PM, and a fourth concave mirror M4 placed on the side of the object field. A mirror group entry MGE is formed between the mutually facing edges of mirrors M2 and M4 on the object-side of the mirror group geometrically close to the first pupil surface P1. The mirror group entry MGE may be formed by a bore or hole in a common substrate of mirrors M2 and M4. The mirror group exit MGO lies outside the optical axis OA next to the edge of the pupil mirror M3 on the opposite side of first mirror M1. As will be explained in more detail in connection with FIG. 3, the pupil mirror M3 and the first mirror M1 may be formed on a common substrate to form a mirror pair, although separate substrates are also possible (see FIG. 2).

The projection objective 100 is designed as a dry objective for operating wavelength λ=193 nm having an image-side numerical aperture NA=0.93. The size of the rectangular effective object field OF is 26 mm*5.5 mm. Image field radius (semidiameter) y'=18 mm. Specifications are summarized in Table 1. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the refractive index of that material. The sixth column lists the optically utilizable, clear, semi diameter [mm] of the optical component. A radius r=0 in a table designates a planar surface (having infinite radius).

A number of surfaces in Table 1, are aspherical surfaces. Table 1A lists the associated data for those aspherical surfaces, from which the sagittal or rising height p(h) of their surface figures as a function of the height h may be computed employing the following equation:

$$p(h)=[((1/r)h^2)/(1+SQRT(1-(1+K)(1/r)^2h^2))]+C1\cdot h^4+C2\cdot h^6+\ldots,$$

where the reciprocal value (1/r) of the radius is the curvature of the surface in question at the surface vertex and h is the distance of a point thereon from the optical axis. The sagittal or rising height p(h) thus represents the distance of that point from the vertex of the surface in question, measured along the z-direction, i.e., along the optical axis. The constants K, C1, C2, etc., are listed in Table 1A.

The projection objective 100 in FIG. 1 is one example of a catadioptric in-line system which is optimized in view of at least two conflicting requirements. Firstly, the advantages of an in-line construction (no folding mirrors, mechanically stable mounting technology etc.) are obtained for large image-side numerical aperture while at the same time the design object field is kept reasonably small. In this context, vignetting control is a key issue. Secondly, a pupil mirror is provided to enable dynamic or static control of imaging properties by deforming the surface shape of the pupil mirror surface. As the pupil mirror is to be placed on the optical axis, the pupil mirror forms an obstacle for the projection beam, thereby making vignetting control more difficult. Thirdly, it has been found that careful control of the correction status of the projection beam at the pupil mirror is required if a targeted control of imaging aberrations to be influenced essentially constant over the field is desired. The solution represented exemplarily by projection objective 100 observes all these requirements (see also FIGS. 3 and 4).

Since the projection beam has to be guided past mirrors in an in-line design without vignetting, it is desirable to keep the regions critical to vignetting as small as possible. In the example this corresponds to a requirement to keep the pupils of the projection beam, i.e. the cross section of the projection beam at the pupil surfaces, as small as possible in the region of the mirrors of the mirror group. According to the Lagrange invariant this requirement transforms to providing unusually large chief ray angles at the pupil positions in or close to the mirror group. The large positive power of the first lens group LG1 (Fourier lens group or front lens group) bending the chief ray CR significantly towards the optical axis serves to provide a small pupil in the first pupil surface P1, which in turn allows a small sized mirror group entry MGI and the extension of reflecting areas of mirrors M2 and M4 very close to the optical axis. In conjunction with positive powers of concave mirrors M1 and M2 a chief ray angle at the pupil mirror PM is further increased to $CRA_{PM} \approx 42°$, leading to a small size of the beam diameter the second pupil surface P2, where the pupil mirror PM is situated. As the size of the reflecting area RA3 of the pupil mirror PM (=M3) can be kept small, vignetting control between fourth mirror M4 and the image surface is facilitated and it is possible to separate the utilized reflecting areas RA1 of first mirror M1 and RA3 at the pupil mirror M3. With other words: the footprints of the projection beam upon reflection on the mirrors M1 and M3 do not overlap. This is one prerequisite for utilizing the pupil mirror PM as a dynamically adjustable manipulator for dynamically influencing the imaging properties of the projection objective.

Further, emphasis is placed on the correction status of the projection beam at the pupil mirror PM, i.e. at the second pupil surface P2. An optimum condition is with regard enabling a field-constant correction of imaging aberrations is obtained if the subapertures corresponding to different field points of the object field have the same size and shape and overlap completely in the pupil surface. If this condition is fulfilled, a local variation of the reflecting properties of the pupil mirror e.g. by deforming the mirror surface, will have a similar effect on all ray bundles originating from different field points, thereby producing a field-constant effect in the image surface. On the other hand, if the subapertures of different field points do not overlap in the pupil surface, a local variation of the reflecting properties of the pupil mirror will affect ray bundles originating from different field points differently, thereby producing a variation of the correcting effect across the field.

Figure 4:
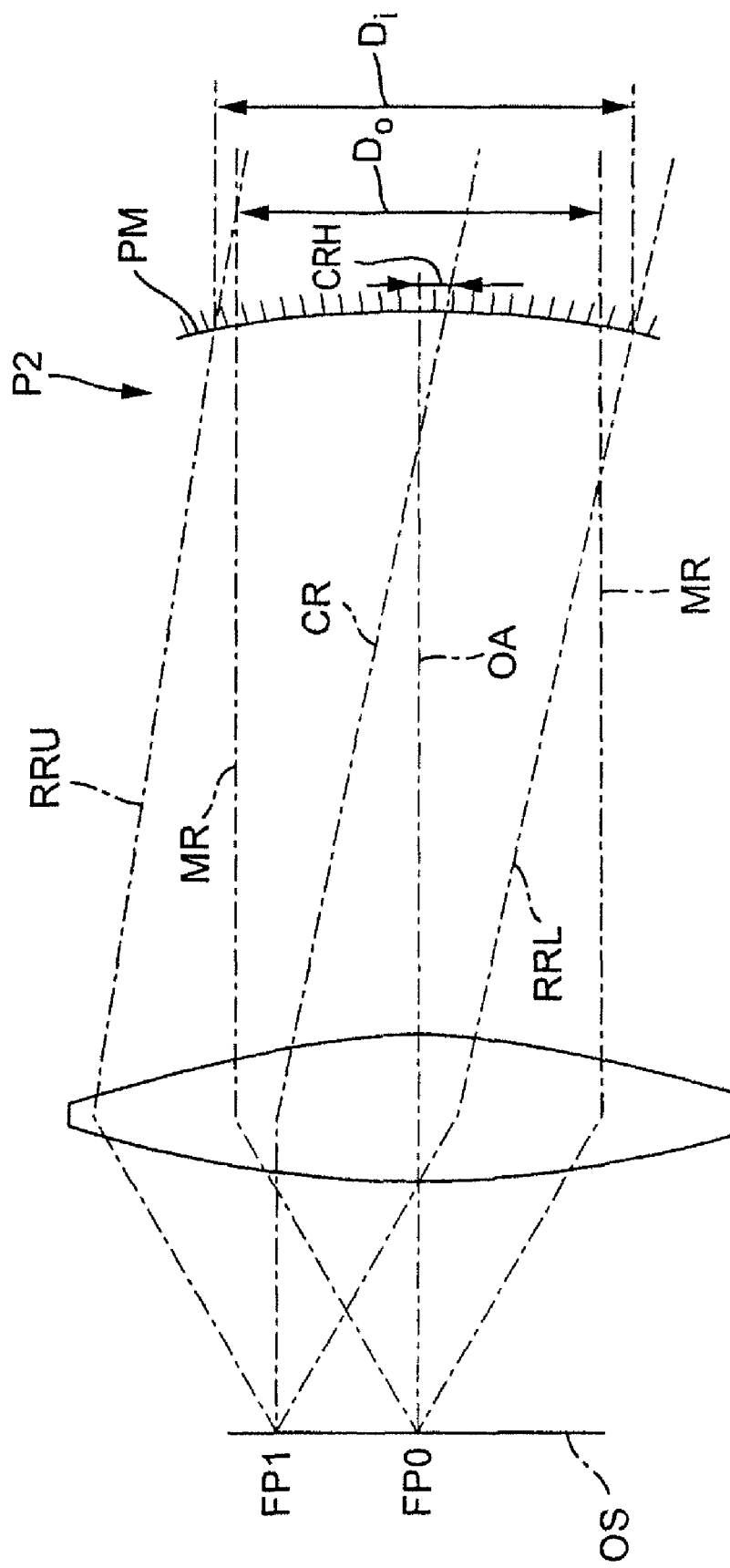
FIG. 4 shows a schematic drawing illustrating features influencing the correction status of the projection beam at the pupil mirror.

In FIG. 4 these conditions are represented in terms of marginal rays MR originating from an field point FPO on the optical axis OA and selected rays representing the ray bundle originating from an off-axis field point FP 1, namely the chief ray CR, the upper rim ray RRU and the lower rim ray RRL. In the ideal case described above (completely overlapping subapertures of ray bundles of all field points at the pupil position) the chief ray CR should intersect the optical axis OA at the position of the reflecting surface of the pupil mirror PM. A deviation from this ideal condition is described by parameter $CRH_i$ describing the ray height (radial distance from the optical axis) of the chief ray CR entering the optical system at the outermost field point FP1 at the pupil mirror PM. This lateral offset should be small in comparison to the amount $D_0$ representing twice the marginal ray height of the marginal ray MR. Further, the meridional diameter of the image of the entrance pupil of the objective at the pupil mirror PM for field point FP1 (expressed by parameter $D_i$) should ideally correspond to the diameter $D_0$ or, in other words, the ratio $D_i/D_0$ should be equal or close to 1. In the embodiment of FIG. 1, the following values are obtained: $|CRH_i|/D_0=0.03$ and $D_i/D_0=0.991$. Substantially the same conditions apply for the sagittal section. Generally, the conditions $|CRH_i|/D_0<0.1$ and $0.9 \leq D_i/D_0 \leq 1.1$ should be obeyed if a manipulation of the shape of the pupil mirror surface is to have an essentially constant effect on the correction status of the image field for all field points.

Figure 3:
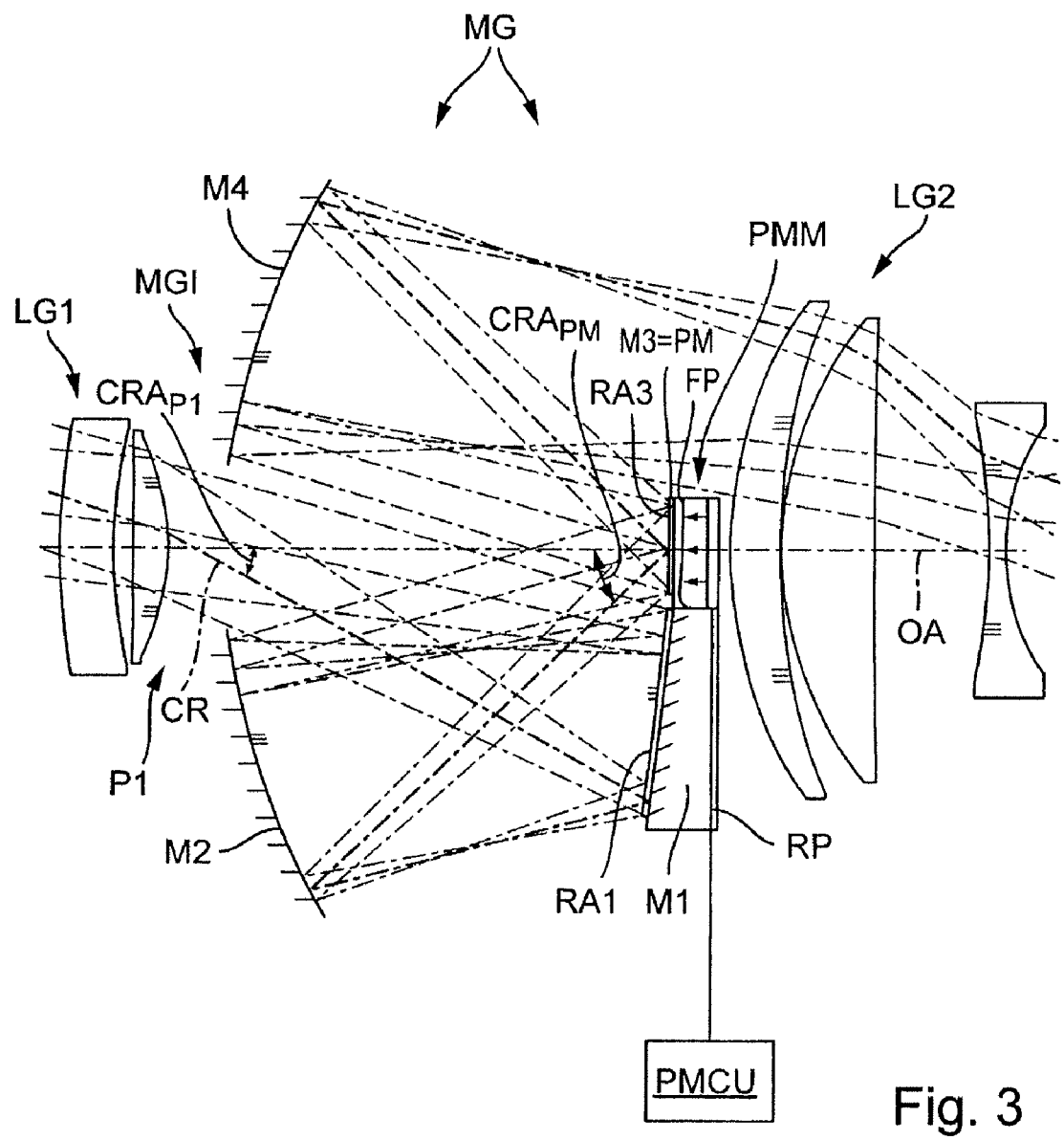
FIG. 3 shows an enlarged detail of the region around the mirror group in the embodiment of FIG. 1 including, on a common substrate, a concave mirror pair forming the adaptive pupil mirror and a mirror illuminated off-axis.

FIG. 3 shows an enlarged detail of the mirror group in FIG. 1 enhancing details of the conditions present around the pupil mirror PM. From a constructive point of view it is shown that first mirror M1 and third mirror M3 form a mirror pair of concave mirrors formed on a common substrate. The substrate has a thick, mechanically rigid portion providing a concave surface carrying the reflective layer forming the first mirror M1. Formed integral with the rigid portion RP is a relatively thin flexible portion FP carrying the reflective coating for the pupil mirror PM. A recess is formed within the mirror substrate on the back side of the flexible portion FP. A number of actuators (represented by arrows) of a pupil mirror manipulator PMM are arranged in the recess and operatively coupled to the back side of the flexible portion FP. The actuators are controlled by a pupil mirror control unit PMCU, which may be an integral part of central control unit of the projection exposure apparatus. The pupil manipulator control unit is connected to receive signals representing a desired deformation of the pupil mirror surface. The pupil mirror manipulator and corresponding control unit may be designed essentially as disclosed in applicants US patent application US 2004/0144915 A1. The corresponding disclosure is incorporated into this application by reference. Any suitable construction of the pupil mirror manipulator may be used instead, for example manipulators using electromechanical actuators, such as piezo-electrical elements, actuators responding to fluid pressure changes, electric and/or magnetic actuators. These actuators may be used to deform a continuous (unbroken) pupil mirror surface as described. The pupil mirror manipulator may also include one or more heating elements or cooling elements effecting local temperature changes of the mirror leading to a desired deformation of the pupil mirror surface. Resistance heaters or Peltier elements may be used for that purpose. The pupil mirror may also be designed as a multi-mirror array having plurality of single micro-mirrors relatively movable with respect to each other in response to corresponding drive signals. Suitable multi-mirror arrays are disclosed, for example in US 2006/0039669. The pupil mirror may be designed in accordance with the principles disclosed in applicants international applications published as WO 2003/093903, the disclosure of which is also incorporated herein by reference.

From an optical point of view it is important to note that the utilized reflecting area RA1 on the first mirror M1 (indicated by bold line) does not overlap with the corresponding reflecting area RA3 on the pupil mirror M3. This allows varying the shape of the pupil mirror surface without affecting the reflection occurring at the first mirror M1. Also, the design is optimized with respect to caustic conditions in the projection beam at the reflecting areas on the concave mirrors and at the lenses, specifically the first lens of second lens group LG2 immediately downstream of the mirror group exit after the second intermediate image. This is accomplished by providing intermediate images essentially corrected for astigmatism and coma which are positioned at relatively large distances away from the optical surfaces of the mirrors and the first lens of lens group LG2. Avoiding caustic conditions at the refracting or reflecting optical surfaces helps to avoid significant local maxima of radiation intensity and facilitates selective aberration control. Furthermore, avoiding caustics on surfaces may relax surface quality specifications.

The embodiment of FIG. 1 may be modified to increase the options for manipulating the imaging quality on a relatively short time scale. For example, the projection objective may include at least one further mirror having a mirror surface which can be manipulated using an associated manipulator operatively connected thereto. Whereas the pupil mirror which can be manipulated is typically arranged at a position where a marginal ray height MRH exceeds the chief ray height CRH, the further mirror may be positioned optically closer to a field surface, particularly at a position optically close to a field surface where a ray height ratio MRH/CRH between marginal ray height and chief ray height is smaller than one or even smaller than 0.5. An adaptive mirror (mirror having a mirror surface which can be varied by a manipulator) positioned optically close to a field surface may be used to correct field dependent aberrations. In a modification of the first embodiment, the first mirror M1 of mirror group MG positioned optically close to an adjacent field surface (intermediate image IMI1) may be designed as an adaptive mirror by providing a field mirror manipulator, which may be similar in construction and operation to the pupil mirror manipulator described above. Since both the pupil mirror M3 and the field mirror M1 may be formed on the same substrate, the actuator design for the filed mirror manipulator and the pupil mirror manipulator can be interconnected to facilitate construction. As an alternative, or in addition, at least one of the second mirror M2 and the fourth mirror M4, which are both optically close to a field surface, may be designed as a mirror having a mirror surface which can be modified or varied using a manipulator. As both mirrors M2 and M4 may be formed on the same substrate a common actuator mechanics may be utilized in that case.

Figure 5:
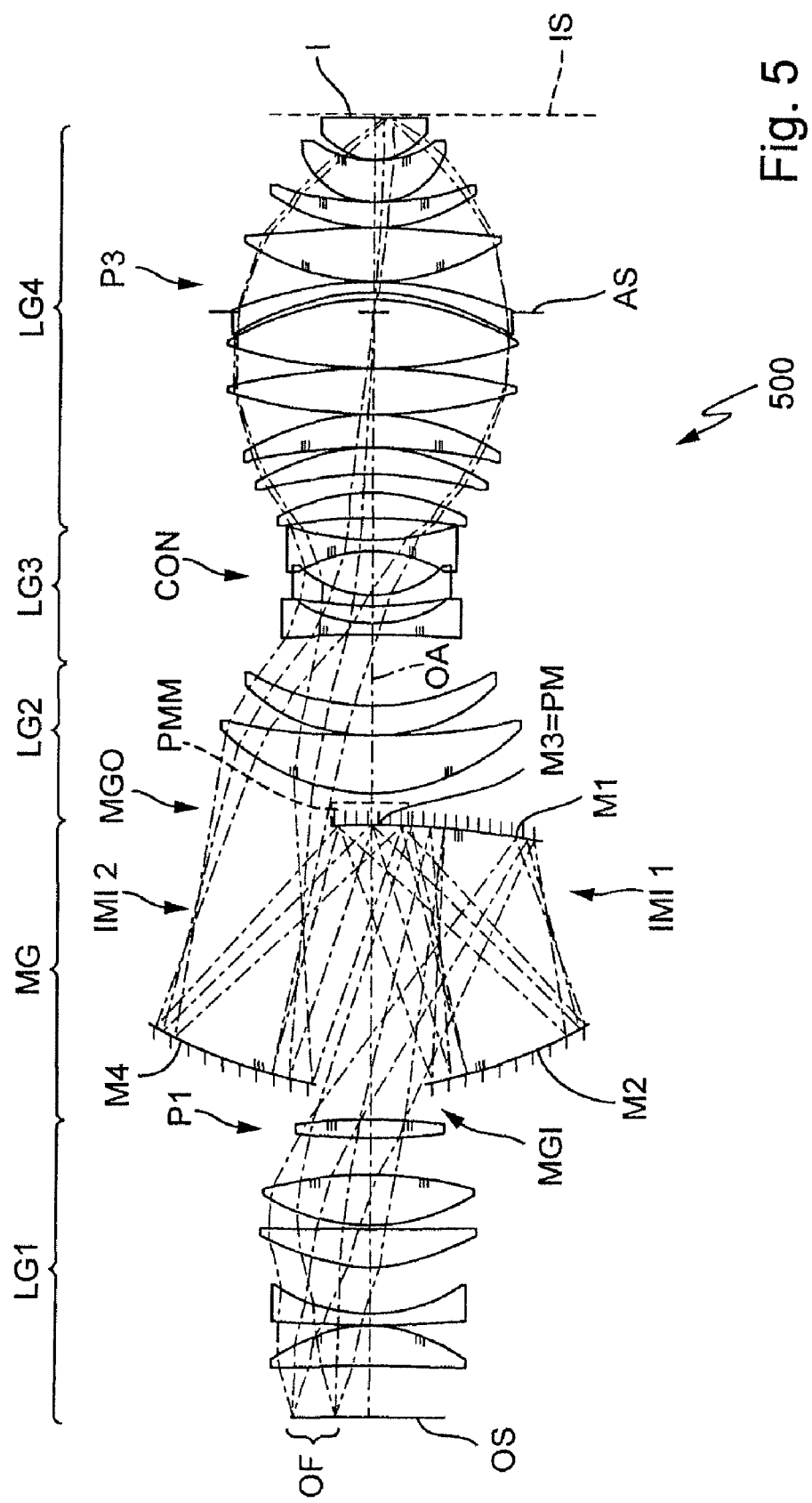
FIG. 5 shows a lens section of a second embodiment of catadioptric in-line projection objective adapted for immersion lithography at NA=1.2 using a rectangular effective object field.

FIG. 5 shows a second embodiment of an in-line projection objective 500 having the general layout as explained in connection with FIGS. 1 and 2 regarding the sequence and type of groups of optical elements (lens groups, mirror group) and the trajectory of the projection beam through the system. Reference is made to the corresponding description. Elements and element group having similar properties as in the previous embodiments are designated with the same reference identifications. The specification for this design is summarized in tables 5, 5A.

The projection objective 500 is designed as an immersion objective for $\lambda=193$ nm having an image-side numerical aperture NA=1.2 when used in conjunction with a high-index immersion liquid I, e.g. pure water, between the exit surface of the projection objective and the image surface IS. The design is optimized for a rectangular effective image field having field size 26×5.5 mm² which can be imaged without vignetting.

As in the embodiment of FIG. 1, a catadioptric first objective part including the first mirror M1 of mirror group MG creates first intermediate image IMI1 situated in an intermirror space of the mirror group MG. Second, third and fourth mirror M1 to M4 of the mirror group MG form a second, catoptric imaging subsystem to form the second intermediate image IMI2 from the first intermediate image. Lens groups LG2, LG3 and LG4 form a third, refractive objective part to a re-image the second intermediate image IMI2 at a reduced scale (magnification ratio about β=−0.125) onto the image surface IS. It is evident that the maximum lens diameters in the image-side belly between constriction CON and the image surface IS found near the aperture stop AS positioned close to the third pupil surface P3 are increased relative to the lower-NA system of FIG. 1. Still, the optically used diameter $D_{PM}$ of pupil mirror PM (mirror M3) remains relatively small, allowing to guide the projection beam past the mirrors without vignetting. The small pupil mirror size is made possible by the strong positive power of first lens group LG1 (serving as Fourier-lens group to form the first pupil at P1) and the positive power of subsequent mirrors M1 and M2, allowing to obtain a chief ray angle $CRA_{PM} \approx 45°$ at the pupil mirror. With other words, the chief ray angle at the pupil mirror is further increased with increasing NA, which, according to the Lagrange invariant, enables to keep the size of the pupil mirror small.

A pupil mirror manipulator PMM is provided to deform the reflecting surface of the pupil mirror as desired, as explained in connection with FIG. 3.

Figure 6:
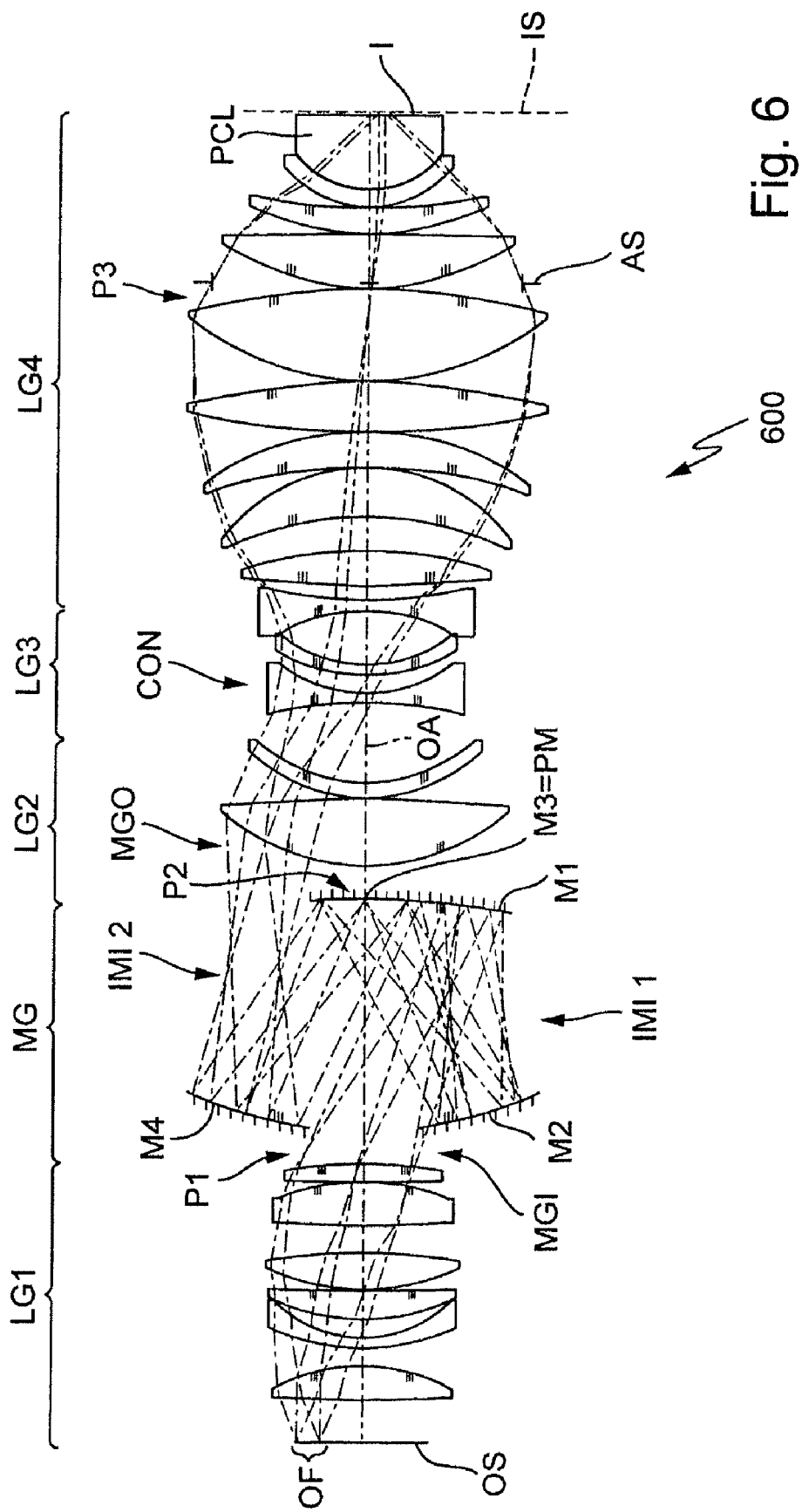
FIG. 6 shows a lens section of a third embodiment of a catadioptric in-line projection objective adapted for immersion lithography at NA=1.55 using an arcuate effective object field (ring field)

FIG. 6 shows a third embodiment of a projection objective 600 designed for immersion lithography at λ=193 nm having an image-side numerical aperture NA=1.55 in a 26×5.5 mm² ring field when used in conjunction with a high-index immersion fluid having refractive index $n_I$=1.65. The last optical element closest to the image surface IS is a plano-convex lens PCL made of LuAG (lutetium aluminium garnet) having refractive index n=2.14 at λ=193 nm. The immersion liquid is cyclohexan with $n_I$=1.65. The specification is given in tables 6 and 6A. This example shows that extremely high numerical apertures may be obtained in in-line systems having a pupil mirror PM (mirror M3) on the optical axis. The aperture stop AS near the image-side third pupil surface P3 is positioned in a region of strongly converging beam between the region of maximum beam diameter within the fourth lens group LG4 and the image surface IS. Although the image-side numerical aperture is drastically increased relative to the embodiment of FIG. 1, the size of the pupil mirror PM remains moderate, which partly is due to the large chief ray angle $CRA_{PM} \approx 36°$ at the second pupil surface P2. Also, vignetting control is facilitated by using an arcuate effective object field OF (ring field).

In all embodiments described above a catadioptric in-line projection objective having an axially compact mirror group MG providing four reflections is used, where the third mirror is placed at a pupil position to provide a pupil mirror (which can be manipulated, if desired). At least two reflections at concave mirrors optically upstream of the pupil mirror are considered favourable for obtaining high chief ray angles $CRA_{PM}$ at the position of the pupil mirror, whereby a small size of the pupil and a small size of the pupil mirror is made possible. A pupil mirror of small dimensions, in turn, enables guiding a high aperture projection beam through the compact mirror group without vignetting at reasonably large effective object field sizes in a reasonably small design object field.

Figure 8:
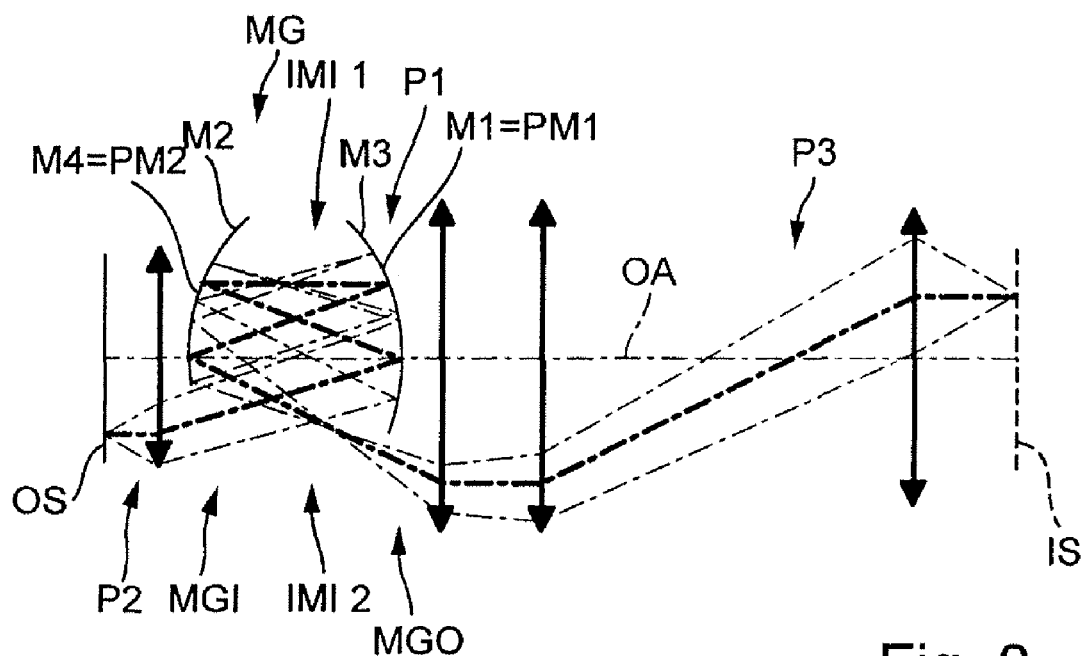
Figure 9:
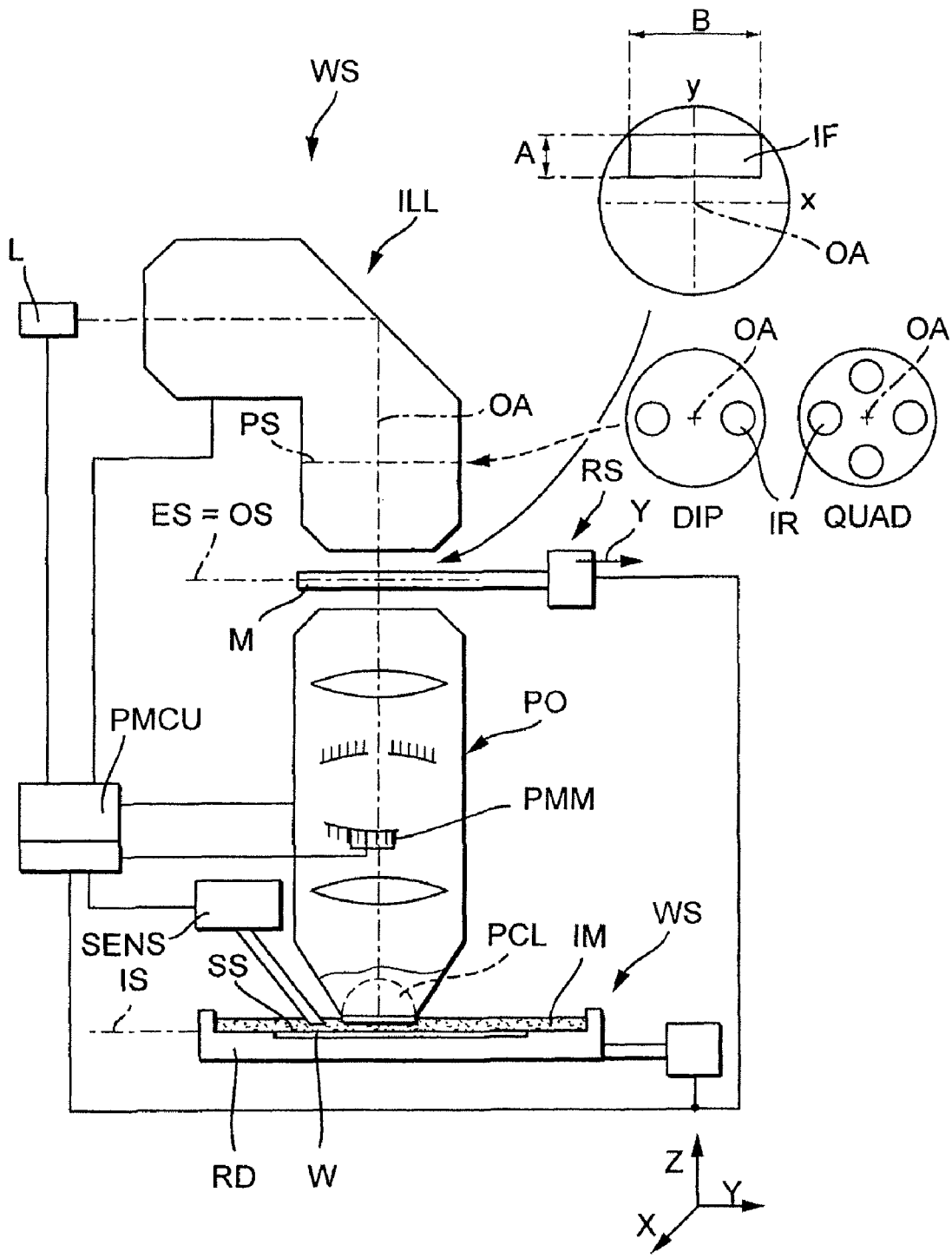
FIG. 9 shows a schematic drawing of a scanning projection exposure system for microlithography having an illumination system designed for creating a slit-shaped illumination field and a catadioptric projection objective having four concave mirrors including a deformable pupil mirror.

FIGS. 8 and 9 show alternative embodiments of catadioptric in-line projection objectives having four reflections in a compact mirror group MG and providing at least one pupil mirror, which may be utilized as a dynamically controllable correcting element for imaging aberrations.

In the embodiments of FIGS. 1 to 6 described above the mirror group entry MGI is positioned close to a pupil surface (first pupil surface) P1, whereas the mirror group exit MGO is positioned optically close to the second intermediate image IMI2 in a region spaced apart from the optical axis OA. The pupil mirror is provided at the third reflection within the mirror group.

Figure 7:
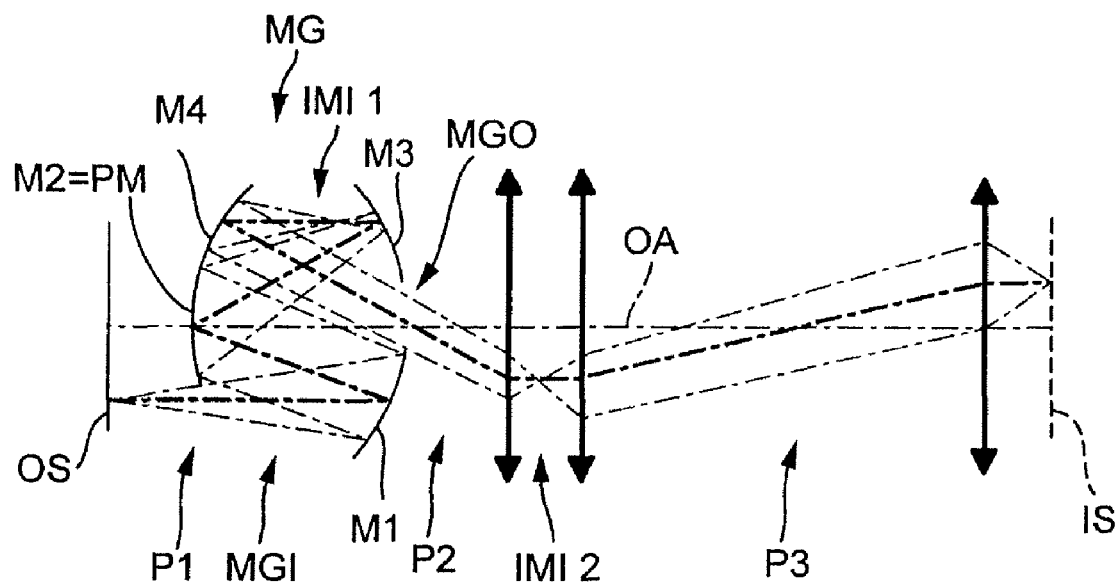
FIGS. 7, 8 show schematic axial sections through alternative embodiments of catadioptric in-line projection objectives each having a mirror group with four concave mirrors including one (FIG. 7) or two (FIG. 8) pupil mirrors.

In the embodiment of FIG. 7 the mirror group MG is placed such that the mirror group entry MGI is positioned outside the optical axis OA optically close to the object surface OS, i.e. optically close to a field surface. There is no lens or lens group between the object surface and the mirror group entry MGI, however, one or more lenses may be provided here. Convex first mirror M1 forms the first optical element and contributes to converging the radiation towards the second mirror M2 being the pupil mirror PM positioned on the optical axis OA. Third mirror M3 converges the radiation to form the first intermediate image IMI1 positioned inside the catadioptric cavity of the mirror group. A catadioptric subsystem including fourth mirror M4 guides the radiation beam through the mirror group exit MGO positioned at the second pupil surface P2. The second intermediate image IMI2 is formed outside the mirror group between positive lens groups (represented by arrows having arrow heads facing outside). A subsequent refractive third objective part reimages the second intermediate image onto the image surface. In this embodiment, the mirrors of the mirror group are basically used in the reversed order when compared to the previous embodiments. This design requires that the effective object field is to be placed well apart from the optical axis, which tends to increase the diameter of the design object field, thereby making it more difficult to project a reasonably sized object field at high numerical apertures without vignetting.

In the embodiment schematically shown in FIG. 8 both the mirror group entry MGI and the mirror group exit MGO are positioned optically close to a field surface (i.e. optically remote from a pupil surface) outside the optical axis OA. The refractive elements placed upstream of the mirror group entry converge the radiation directly towards the first mirror M1, which is the first pupil mirror PM1 of the system. A second pupil is formed after reflections at second mirror M2 and third mirror M3 at the position of fourth mirror M4, which is the second pupil mirror PM2 of the system. First intermediate image IMI1 is formed between the second and third reflection, second intermediate image IMI2 is formed downstream of the fourth reflection, where both intermediate images are positioned inside the space defined by the surfaces of curvature of the mirrors of the mirror group. Second intermediate image IMI2 is re-imaged onto the image surface by subsequent refractive lens groups. Either first mirror M1 or fourth mirror M4 or both the first and the fourth mirror may be designed as adaptive mirrors allowing to manipulate the shape of the pupil mirror surface in order to dynamically compensate imaging errors within the system. With a given object height it is difficult to obtain large chief ray angles at the first pupil mirror PM1 and on the second pupil mirror PM2, whereby the pupil mirror size will increase significantly with increasing image-side numerical aperture. This effect tends to limit the capability to transport large geometrical flux (etendue) without vignetting. Also, relatively large lenses are required immediately downstream of the mirror group to capture the divergent beam exiting the mirror group exit MGO. Systems of this type may favourably be used with relatively large reduction ratios, e.g. 8:1 instead of 4:1, since the object-side numerical aperture and object field height can be reduced in comparison to systems with smaller reduction ratios, such as 4:1.

FIG. 9 shows schematically a microlithographic projection exposure system in the form of a wafer scanner WS, which is provided for fabricating large scale integrated semiconductor components by means of immersion lithography in a step-and-scan mode. The projection exposure system comprises as light source an Excimer laser L having an operating wavelength of 193 nm. Other operating wavelengths, for example 157 nm or 248 nm, are possible. A downstream illumination system ILL generates, in its exit surface ES, a large, sharply delimited, homogeneously illuminated illumination field arranged off-axis with respect to the optical axis of the projection objective PO and adapted to the telecentric requirements of the downstream catadioptric projection objective PO. The illumination system ILL has devices for selecting the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that the mask lies in the exit surface ES of the illumination system coinciding with the object surface OS of the projection objective PO and can be moved in this plane for scanning operation in a scanning direction (Y-direction) perpendicular to the optical axis OA common to the illumination system and the projection objective (i.e. the Z-direction).

The size and shape of the illumination field IF provided by the illumination system determines the size and shape of the effective object field OF of the projection objective actually used for projecting an image of a pattern on a mask in the image surface of the projection objective. The slit-shaped illumination field IF has a height A parallel to the scanning direction and a width B>A perpendicular to the scanning direction and may be rectangular (as shown in the inset figure) or arcuate (ring field).

The reduction projection objective PO is telecentric at the object and image side and designed to image an image of a pattern provided by the mask with a reduced scale of 4:1 onto a wafer W coated with a photoresist layer. Other reduction scales, e.g. 5:1 or 8:1 are possible. The wafer W serving as a light-sensitive substrate is arranged in such a way that the planar substrate surface SS with the photoresist layer essentially coincides with the planar image surface IS of the projection objective. The wafer is held by a device WS (wafer stage) comprising a scanner drive in order to move the wafer synchronously with the mask M in parallel with the latter. The device WS also comprises manipulators in order to move the wafer both in the Z direction parallel to the optical axis OA and in the X and Y directions perpendicular to said axis. A tilting device having at least one tilting axis running perpendicular to the optical axis is integrated.

The device WS provided for holding the wafer W (wafer stage) is constructed for use in immersion lithography. It comprises a receptacle device RD, which can be moved by a scanner drive and the bottom of which has a flat recess for receiving the wafer W. A peripheral edge forms a flat, upwardly open, liquid-tight receptacle for a liquid immersion medium IM, which can be introduced into the receptacle and discharged from the latter by means of devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has a planoconvex lens PCL as the last optical element nearest to the image surface IS, the planar exit surface of said lens being the last optical surface of the projection objective PO. During operation of the projection exposure system, the exit surface of the last optical element is completely immersed in the immersion liquid IM and is wetted by the latter. In the exemplary case, ultrapure water having a refractive index $n_I \approx 1.437$ (193 nm) is used as the immersion liquid.

A temperature sensor SENS is provided to monitor the temperature of the immersion liquid IM during operation of the projection exposure system. For this purpose, a sensing element responsive to temperature changes is placed close to the exit surface of the projection objective PO to monitor the temperature of the immersion layer transirradiated during exposure. The temperature sensor is connected to the central control unit of the exposure system including a pupil mirror control unit PMCU provided to control the shape of the reflecting surface of a pupil mirror of the projection objective PO using a pupil mirror manipulator PMM (compare e.g. FIG. 3). Pupil mirror control unit PMCU includes a digital storage containing a look-up table for converting the temperature signals provided by temperature sensor SENS into values for the refractive index of the immersion liquid IM in the immersion layer. As the temperature of the immersion layer may change during exposure due to absorption of radiation intensity of the projection beam (temperature increase) or due to inflow of fresh immersion liquid into the space between the projection objective exit surface and the wafer (temperature increase or decrease), fluctuations of the refractive index of the immersion layer may occur. These may cause field-constant contributions to spherical aberrations influencing the image formation on the wafer. These fluctuations of optical properties of the image-side telecentric projection system are compensated for by adjusting the reflective shape of the pupil mirror such that a corresponding amount of spherical aberration is introduced by the pupil mirror in order to compensate the influence of the immersion layer on spherical aberration. A stable immersion lithographic process is obtained utilizing such control-loop.

The pupil mirror control unit PMCU is also configured to receive signals from the illumination system ILL indicative of the illumination setting used in an exposure and includes a control routine allowing to adjust the pupil mirror surface in correspondence with the selected illumination setting. For example, where the pattern of the mask to be projected on the wafer essentially consists of parallel lines running in one direction, a dipole setting DIP (see left inset figure) may be utilized to increase resolution and depth of focus. To this end, adjustable optical elements in the illumination system are adjusted to obtain, in a pupil surface PS of the illumination system ILL, an intensity distribution characterized by two locally concentrated illuminated regions IR of large light intensity at diametrically opposed positions outside the optical axis OA and little or no light intensity on the optical axis. A similar inhomogeneous intensity distribution is obtained in pupil surfaces of the projection objective optically conjugate to the pupil surface of the illumination system. As a result, lenses at or near the first and third pupil surfaces P1, P3, respectively, of projection objectives described above may be subject to spatially inhomogeneous radiation loads characterized by two "hot areas" at diametrically opposed regions outside the optical axis, which may lead to local absorption-induced lens heating, causing characteristic lens deformations and refractive index variations, which, in turn, cause a characteristic deformation of the wavefront characterized by an essentially two-fold radial symmetry with respect to the optical axis.

Appropriate manipulations of the pupil mirror surface are utilized to compensate for these effects by providing an appropriate deformation of the pupil mirror surface with a two-fold radial symmetry at the correct orientation with respect to the optical axis.

If the illumination setting is changed to obtain, for example, conventional illumination (rotational symmetry around the optical axis) or quadrupole illumination (four-fold radial symmetry around the optical axis, see right hand side inset figure QUAD with four off-axis illuminated regions IR), the pupil mirror control unit will provide corresponding signals to the pupil mirror manipulator to change the surface shape of the pupil mirror accordingly.

Illumination systems capable of optionally providing the described off-axis polar illumination modes are described, for example, in U.S. Pat. No. 6,252,647 B1 or in applicant's patent application US 2006/005026 A1, the disclosure of which is incorporated herein by reference. The adaptation of the pupil mirror configuration to an illumination setting may be used in immersion systems, such as described exemplarily above, as well as in dry systems, i.e. systems using dry objectives with NA<1.

In other embodiments (not shown) the control signals for the pupil mirror manipulator provided to deform the reflective surface of the pupil mirror during operation are derived from empirical values or calculated values of control parameters stored in the pupil mirror control unit. In these embodiments, direct or indirect measurement of the imaging properties of the projection system is not necessary.

Further catadioptric projection objectives with a concave pupil mirror and control systems to control the shape of the reflective surface of the pupil mirror are now described in connection with FIGS. 10 and 11.

Figure 10:
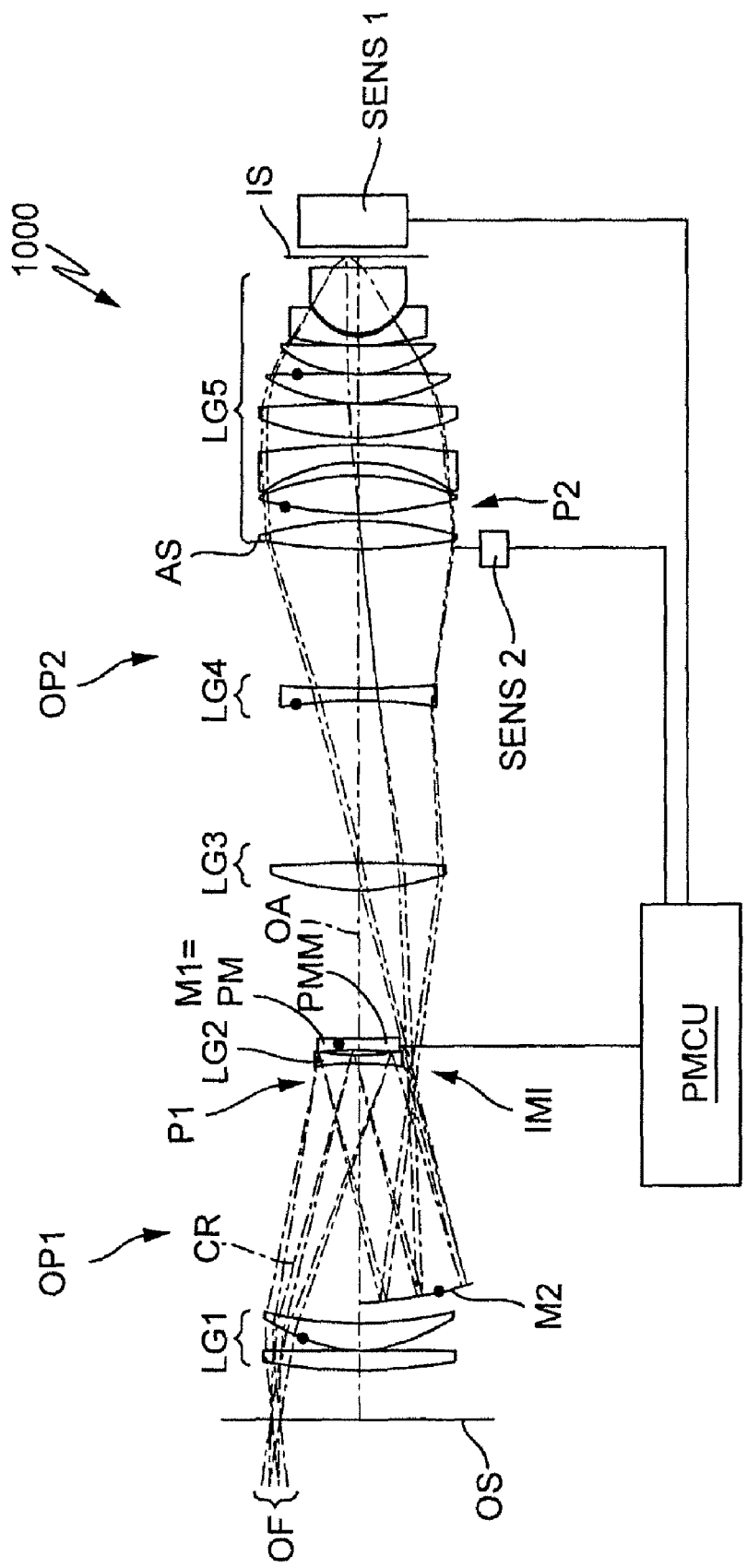
FIG. 10 shows a lens section of a catadioptric in-line projection objective adapted for dry lithography at NA=0.75 using an arcuate effective object field (ring field)

FIG. 10 shows a catadioptric projection objective 1000 designed for a nominal UV-operating wavelength $\lambda=193$ nm. The layout of the projection objective with regard to number, shape, position of lenses and other optical elements is taken from a prior art projection objective shown in FIG. 4 and discussed as second embodiment (table 2) in European patent EP 1 069 448 B1. The disclosure of that reference is incorporated herein by reference. The projection objective is adapted to "dry lithography" having a gas filled space between the exit surface of the projection objective and the image surface. An image-side numerical aperture NA=0.75 is obtained at a reducing magnification 6:1 ($|\beta|=\frac{1}{6}$) in an arcuate off-axis image field. Other embodiments may have different magnification ratio, for example $|\beta|=\frac{1}{5}$ or $|\beta|=\frac{1}{4}$, or $|\beta|=1$ (unit magnification).

Projection objective 1000 is configured to project an image of a pattern from a mask (reticle) arranged in the planar object surface OS (object plane) into the planar image surface IS (image plane) while creating exactly one real intermediate image IMI. A first catadioptric objective part OP1 is designed to image the pattern from the object surface into the intermediate image IMI. A second, purely refractive objective part OP2 images the intermediate image directly (i.e. without further intermediate image) into the image surface. Two mutually conjugated pupil surfaces P1 and P2 are formed at positions where the CR intersects the optical axis OA. The first pupil surface P1 is formed in the first objective part, whereas a second pupil surface P2 is formed in the second objective part OP2. While the first objective part OP1 has only moderate reduction effect, a major contribution to overall reduction is provided by the refractive second objective part OP2. All optical elements are aligned along a single, straight optical axis OA allowing a parallel orientation of object surface OS and image surface IS. An exit pupil of the projection objective is substantially circular. First concave mirror M1 is positioned very close to the first pupil surface P1, thereby forming a pupil mirror PM.

First objective part OP1 has a positive lens group LG1 formed by two positive meniscus lenses, a negative lens group LG2 formed by a single, biconcave negative lens, a first concave mirror M1 immediately downstream of the negative lens group LG2 having a reflecting surface facing the object surface, and a second concave mirror M2 having a concave surface facing the first concave mirror and the image surface. The second objective part OP2 has a positive lens group LG3 formed by a single positive lens, a negative lens group LG4 formed by a single bi-concave negative lens, and a positive lens group LG5 including five positive lenses and two negative lenses between the second pupil surface P2 and the image surface. A variable aperture stop AS allowing to adjust the used image-side numerical aperture NA is positioned at the second pupil surface between the fourth and fifth lens group.

Radiation from the object surface is converged by the positive first lens group LG1 towards the first concave mirror M1 and reflected by the first concave mirror towards the second concave mirror M2, which converges the radiation to form the first intermediate image. Radiation guided towards and reflected from first concave mirror M1 passes the negative lens group LG2 twice in opposite directions. Both the reflecting surface of the first concave mirror M1 and the negative lens group LG2 are positioned optically very close to the second pupil surface P2 at a position where the cross-section of the radiation beam deviates only little from a circular shape and where the marginal ray height is at least 4 times or even at least 5 times larger than the chief ray height. The combination of a concave mirror M1 placed at or very close to pupil surface, and a negative lens group LG2 coaxial therewith and passed twice by radiation acts in the manner of a "Schupmann achromat" to support correction of chromatic aberrations, particularly correction of axial chromatic aberration. Second objective part OP2 re-images the intermediate image IMI1 to form the final image in the image surface IS.

A pupil mirror manipulator PMM attached to the backside of the pupil mirror PM (M1) is configured to vary the shape of the aspheric reflective surface of the pupil mirror by means of appropriate actuators (not shown). The general design of the pupil mirror manipulator may be the same as described in connection with FIG. 3, or different therefrom. The actuators are controlled by a pupil mirror control unit PMCU, which may be an integral part of the central control unit of the projection exposure apparatus. The pupil mirror control unit is configured to generate control signals for the actuators of the pupil mirror manipulator to adjust the surface shape of the pupil mirror such that the desired target shape is obtained.

The pupil mirror control unit PMCU is connected to a first sensor SENS1 and a second sensor SENS2. The first sensor SENS1 is integral part of a measuring system, such as an interferometer, allowing to measure the imaging quality of the projection objective in operation and to provide signals indicative of the measured values describing the optical performance. For example, the first sensor SENS1 may be configured to detect wavefront aberrations of the wavefront incident on the image surface. Examples of wavefront measurement systems suitable for this purpose are given in US 2002/0001088 A1, for example, the disclosure of which is incorporated herein by reference. The second sensor SENS2 is configured to derive signals indicative of the present status of the aperture stop, thereby allowing to derive, for example, the present image-side numerical aperture NA used in the process. Alternatively, or in addition, a second sensor may also be provided to derive signals indicative of an intensity or intensity distribution in a pupil surface or signals indicative of the wavefront characteristics in a pupil surface and/or in a field surface of the projection objective.

A similar control circuit may be provided in embodiments having more than one intermediate images, such as two intermediate images and/or in folded systems.

Figure 11:
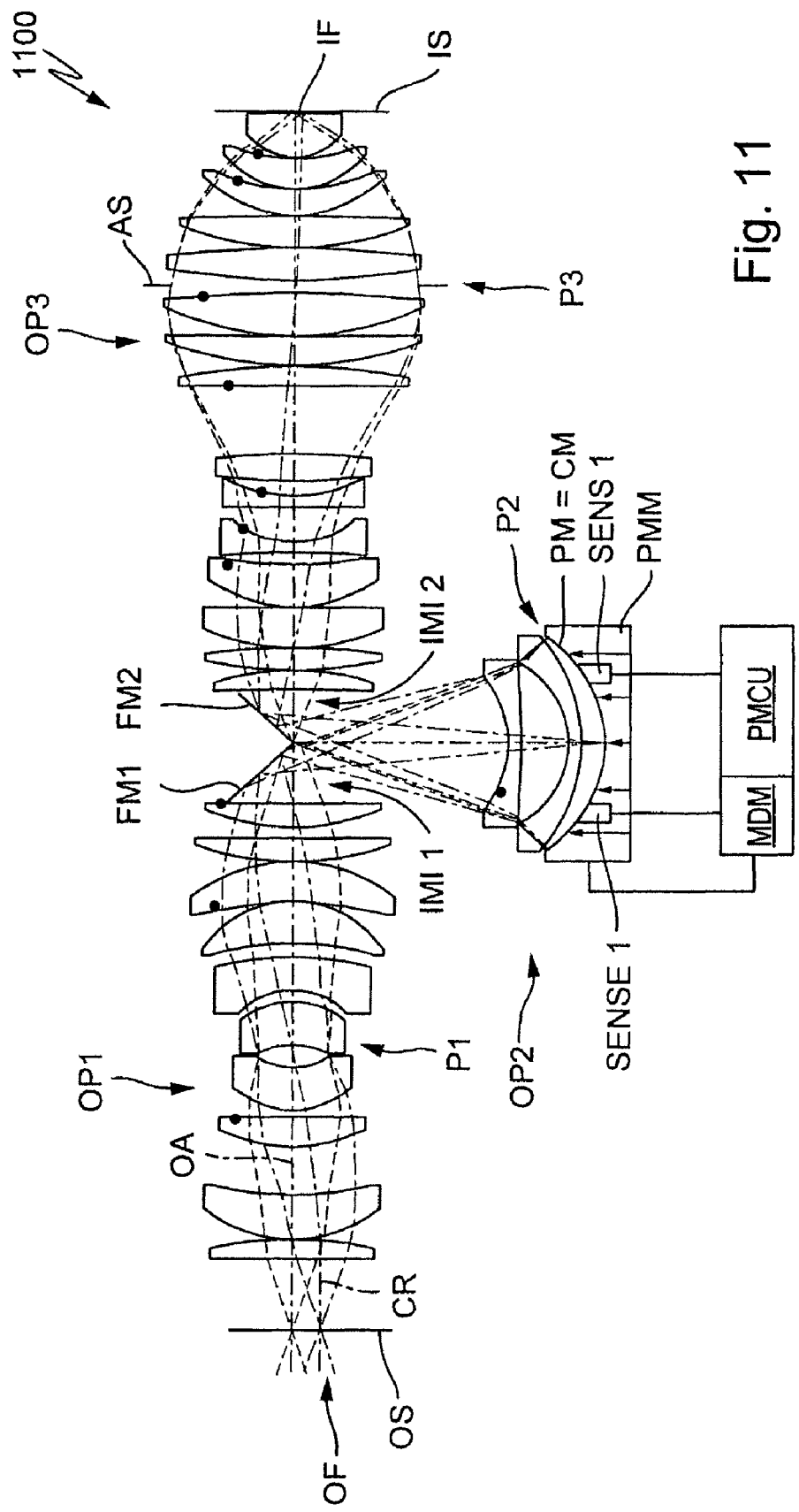
FIG. 11 shows a lens section of an embodiment of a folded catadioptric projection objective adapted for immersion lithography at NA=1.25 using a rectangular effective object field.

FIG. 11 shows a catadioptric projection objective 1100. The projection objective is designed for a nominal UV-operating wavelength λ=193 nm. The layout of the projection objective with regard to number, shape, position of lenses and other optical elements is taken from the prior art projection objective shown in FIG. 19 and discussed as embodiment 5 (Tables 9 and 10) in international patent application WO 2004/019128 A2. The respective disclosure of that reference is incorporated herein by reference. An image-side numerical aperture NA=1.25 is obtained at a reducing magnification 4:1 in a rectangular off-axis image field with size 26 mm×4 mm.

Projection objective 1100 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis OA. A first refractive objective part OP1 is designed for imaging the pattern in the object surface into the first intermediate image IMI1. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a single concave mirror CM at the second pupil surface P2, thereby forming a pupil mirror PM. A first planar folding mirror FM1 is arranged optically close to the first intermediate image IMI1 at an angle of 45° to the optical axis OA such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM (pupil mirror PM) in the direction of the image surface, which is parallel to the object surface. The folding mirrors FM1, FM2 are each located in the optical vicinity of an intermediate image.

The projection objective has 27 lenses including two negative meniscus lenses forming a negative group immediately in front of the concave mirror CM and passed twice by radiation on its way from first folding mirror FM1 towards the concave mirror, and from the concave mirror towards the second folding mirror FM2. A combination of a concave mirror arranged at or optically close to a pupil surface and a negative group comprising at least one negative lens arranged in front of the concave mirror on a reflecting side thereof in a double pass region such that radiation passes at least twice in opposite directions through the negative group is sometimes referred to as "Schupmann achromat". This group contributes significantly to correction of chromatic aberrations, particularly axial chromatic aberration.

A pupil mirror manipulator PMM is provided at the freely accessible backside of the concave mirror CM. The pupil mirror manipulator includes a number of actuators (represented by arrows) acting on the backside of a flexible mirror substrate to allow varying the shape of the reflective surface continuously in response to control signals provided by a pupil mirror control unit PMCU connected to the pupil mirror manipulator PMM. First sensors SENS1 are operatively connected to the flexible mirror substrate to allow sensing the state of deformation of the reflecting surface two-dimensionally with high spatial resolution. The pupil mirror control unit is connected to the sensors SENS1 to receive feedback signals representing the actual status of deformation of the pupil mirror surface. The pupil mirror manipulator and corresponding control unit may be designed essentially as described in connection with FIG. 3 above. First sensors SENS1 may be electromechanical sensors to derive electrical signals from a mechanic condition of the pupil mirror. Alternatively, or in addition, a sensor system monitoring the status of deformation of a concave mirror may be designed according to the principles outlined in U.S. Pat. No. 6,784,977 B2. The respective disclosure of this document is incorporated herein by reference.

In general, the mirror arrangement formed by the pupil mirror and the pupil mirror manipulator configured to deform or change the shape of the reflective pupil mirror surface may be constructed as described or in various other ways. Examples are given in U.S. Pat. No. 5,986,795 or applicants patent application US 2006/0018045 A1. The respective disclosures of these documents is incorporated herein by reference Control of a pupil mirror manipulator for effecting a targeted deformation of the reflecting surface of the pupil mirror may be configured in a variety of ways independent of the design type (folded or in-line) and the number of intermediate images.

In some embodiments the control system controlling the pupil mirror manipulator includes a control circuit configured to receive at least one input signal indicative of at least one condition of the projection objective or another part of the projection exposure apparatus and to output to the pupil mirror manipulator a control signal representing an adjustment of the surface shape of the pupil mirror to adapt imaging characteristics of the projection objective in response to the input signal. The control circuit may be operated in the manner of an open-loop control.

For example, an input signal indicative of the illumination setting (e.g. dipole illumination or quadrupole illumination) may be received from the illumination system and processed in the control circuit to generate control signals causing the actuators of the pupil mirror manipulator to deform the reflective surface of the pupil mirror to obtain a surface deformation with two-fold or four-fold rotational symmetry, respectively such that at least part of the inhomogeneous lens heating to be expected upon polar illumination is compensated by the uneven deformation of the pupil mirror surface. Alternatively, or in addition, other input signals may be generated and processed, for example input signals representing the type of pattern (e.g. line pattern, hole pattern, and/or pattern with lines in different directions), input signals representing the numerical aperture NA and/or input signals representing exposure times.

Even higher stability of optical performance and a better response to disturbance may be obtained in embodiments incorporating a closed-loop control of the projection objective performance. Unlike simple open-loop control a closed-loop control introduced feedback into the control circuit. In some embodiments the control circuit includes at least one feedback circuit including at least one first sensor configured to detect the surface shape of the reflective surface of the pupil mirror or a property of the projection objective correlated to the surface shape, where the sensor is connected to the pupil mirror control unit to provide a feedback signal, and the pupil mirror control unit is configured to optionally modify the control signal controlling the pupil mirror manipulator in response to the feedback signal. For example, a wavefront measuring device or another measuring system capable of measuring the optical performance of the projection objective may be used to generate signals indicative of the level of aberrations present in the wavefront incident on the image surface and/or in the pupil surface, for example. The level of aberrations may be characterized by one or more aberration including one or more monochromatic aberration, such as spherical aberration, coma, astigmatism, field curvature and distortion and/or one or more chromatic aberrations including axial and lateral chromatic aberration and chromatic variations of monochromatic aberrations, for example. Where the aberrations exceed a predefined threshold value, the pupil mirror control unit may generate control signals to adjust the surface shape of the pupil mirror such that the level of critical aberrations is reduced below the threshold value, which is typically given by the specifications provided by the end-user for a certain process. An apparatus for wavefront detection as described in applicant's patent applications US 2002/0011088 A1 may be utilized in connection with a close-loop control to optimize the surface shape of pupil mirror.

The surface shape of the pupil mirror or a property of the projection objective directly correlated to the surface shape may be monitored constantly or intermittently to derive a feedback signal.

The at least one input signals which is processed in an open-loop control circuit or in an closed-loop control circuit may be derived from a parameter which may be derived from a measurement on the projection objective, i.e. the parameter can be detected directly in the system. It is also possible to derive one or more input signals from a simulation model that reproduces the projection objective or a part thereof or the entire projection exposure apparatus with an adequate degree of preciseness such that meaningful control parameters and signals can be derived from the simulation model. In this case, control of the pupil mirror may include aspects of model-based control (MBC). To this end, the pupil mirror control unit may include or may be connected to a model data memory storing model data representing model parameters of a simulation model of the projection objective and/or of the projection exposure apparatus including the projection objective. The control system may derive at least one input signal for a control circuit from the model data stored in the model data memory. The projection objective may include one or more second sensors for detecting actual status parameters on the projection objective to derive actual observable parameters corresponding to model parameters of the simulation model.

For example, in the feedback control system shown in FIG. 11, the pupil mirror control unit PMCU includes a model data memory MDM storing model data representing model parameters of a simulation model of the projection objective 1100 and/or of the projection exposure apparatus including the projection objective. The model data memory MDM may be incorporated into an external device, accessible by the pupil mirror control unit via a data network. In the embodiments above, the model data memory MDM may have stored one or more of the following data: temperature data representing temperature of one of more component; temperature distribution data representing spatial temperature distribution on one or more components; position data representing at least one of axial position of one or more components, decentering or tilt of one or more components; shape data representing the shape of the reflective surface of a pupil mirror; aperture data representing aperture stop condition (used NA); setting data representing an illumination setting; radiation power data representing power of the radiation source; aberration data representing spatial distribution of one or more aberrations in the image field or in a pupil surface of the projection objective; immersion data representing at least one property of an immersion medium including data indicating the presence or absence of an immersion medium; pattern data representing information on a type of pattern provided by a mask or another patterning means. The simulation model may be calibrated at intervals using measured parameters which correspond to the model parameters for which data are stored to maintain a close correlation between the simulation model and the actual system under operation.

Incorporating features of model-based control into controlling the manipulations on an adaptive pupil mirror may be advantageous particularly considering that some of the problems to be addressed with an adaptive pupil mirror, such as lens heating effects, are dynamic effects evolving with certain time constants. Further, in general there is no simple relationship between distribution of radiation energy within an optical system and the corresponding effect on the optical performance. Where a closed-loop control circuit is used, the actual optical performance of the projection objective is compared at given time intervals with a prescribed theoretical or desired value, typically given by the user's specification. If deviations occur between the actual values and the desired value, the control circuit is effective to decrease the deviations by appropriate manipulations, which may include manipulations on the pupil mirror, for example. In general such close-loop control is reactive on observed errors and effective to remove or minimize those errors. In general, integrating aspects of model-based control may be used to perform a predictive control of the optical system, thereby allowing to take into account at least some future changes to be expected in the system for which the simulation model is designed. A forward-acting control may thereby be obtained.

A lithographic projection apparatus including a measurement system for measuring changes in projection system aberrations with time, and a predictive control system for predicting variation of projection system aberrations with time on the basis of model parameters is disclosed, for example, in US 2006/0114437 A1. As far as the concept may be modified to be used in controlling an adaptive pupil mirror the disclosure of this document is incorporated herein by reference.

Constant or intermittent calibration of the simulation model may be performed on the basis of signals derived from actual measurements of properties of the modelled system. Properties to be detected or determined on the physical system (e.g. the projection objective or entire exposure apparatus) may include one or more of the following: Temperature of one of more component, spatial temperature distribution on one or more components, axial position of one or more components, decentering or tilt of one or more components, shape of the reflective surface of a pupil mirror, aperture stop condition (used NA), illumination setting, power of the radiation source, spatial distribution of one or more aberrations in the image field and/or in the exit pupil of the projection objective, wavefront in a pupil surface, such as the exit pupil, intensity or spatial distribution of intensity in a pupil surface, such as the exit pupil, pattern information representing the type of pattern provided by a mask or another patterning means. For example, the pattern information may be derived from reading relevant pattern identification data from a mask and/or from data stored in an exchangeable memory component associated with each mask and/or from data stored in a permanent memory component.

The various configurations of control systems controlling a deformable mirror may be used in embodiments according to the claimed disclosure and in other projection exposure systems, e.g. independent of folding geometry and number of intermediate images. For example, projection objectives with more than two intermediate images are possible. Projection objectives having three intermediate images may be designed essentially in accordance with the teaching of applicant's international patent application WO 2005/040890 A, the disclosure of which is incorporated herein by reference.

Certain embodiments have been disclosed. Other embodiments are in the following claims.

TABLE 1

| (k345) NA = 0.93; y' = 18 mm; l = 193 nm | | | | | |
|---|---|---|---|---|---|
| SURFACE | RADIUS | THICKNESS | MATERIAL | INDEX | SEMIDIAM. |
| 0 | 0.000000 | 61.801666 | | | 72.0 |
| 1 | −1702.386146 | 41.325453 | SILUV | 1.560383 | 86.3 |
| 2 | −121.192168 | 4.360896 | | | 88.1 |
| 3 | −4286.193831 | 9.998630 | SILUV | 1.560383 | 80.2 |
| 4 | 124.412455 | 12.235564 | | | 75.6 |
| 5 | 131.473424 | 30.732311 | SILUV | 1.560383 | 79.0 |
| 6 | 541.381752 | 29.316531 | | | 77.9 |
| 7 | 745.128550 | 25.213130 | SILUV | 1.560383 | 75.9 |
| 8 | −191.637943 | 14.825939 | | | 75.8 |
| 9 | 375.688171 | 30.763422 | SILUV | 1.560383 | 66.7 |
| 10 | 324.309545 | 9.561348 | | | 60.1 |
| 11 | −2063.733277 | 18.915876 | SILUV | 1.560383 | 59.4 |
| 12 | −145.395892 | 295.863062 | | | 58.5 |
| 13 | −822.785979 | −264.870609 | REFL | | 152.4 |
| 14 | 407.281462 | 264.870609 | REFL | | 202.9 |
| 15 | −822.785979 | −264.870609 | REFL | | 25.8 |
| 16 | 407.281462 | 295.870325 | REFL | | 205.6 |
| 17 | 256.855365 | 28.769443 | SILUV | 1.560383 | 136.4 |
| 18 | 543.786760 | 0.999115 | | | 133.2 |
| 19 | 216.433470 | 49.965930 | SILUV | 1.560383 | 126.8 |
| 20 | 7003.252999 | 68.468675 | | | 122.5 |
| 21 | −213.438117 | 9.999099 | SILUV | 1.560383 | 77.6 |
| 22 | 117.646978 | 67.280411 | | | 64.3 |
| 23 | −77.375022 | 9.997488 | SILUV | 1.560383 | 60.7 |
| 24 | −107.231487 | 1.005067 | | | 65.9 |
| 25 | −825.547391 | 9.999331 | SILUV | 1.560383 | 67.4 |
| 26 | 136.925013 | 18.390269 | | | 69.9 |
| 27 | 135.662987 | 56.189761 | SILUV | 1.560383 | 85.0 |
| 28 | −179.157647 | 0.996549 | | | 86.1 |
| 29 | −1602.877717 | 9.997060 | SILUV | 1.560383 | 83.3 |
| 30 | 125.633508 | 17.961693 | | | 80.5 |
| 31 | 231.371183 | 32.976244 | SILUV | 1.560383 | 82.5 |
| 32 | −455.317032 | 0.993075 | | | 83.8 |
| 33 | 210.038142 | 34.084147 | SILUV | 1.560383 | 86.4 |
| 34 | −665.255448 | −2.017056 | | | 85.4 |
| 35 | 0.000000 | 7.719889 | | | 84.6 |
| 36 | −1581.251949 | 9.996133 | SILUV | 1.560383 | 84.6 |
| 37 | 163.810237 | 10.584738 | | | 88.2 |
| 38 | 227.488145 | 55.231527 | SILUV | 1.560383 | 91.4 |
| 39 | −180.165995 | 0.995051 | | | 93.4 |
| 40 | 136.219275 | 54.208368 | SILUV | 1.560383 | 91.8 |
| 41 | −546.417048 | 0.992586 | | | 87.2 |
| 42 | 92.896046 | 39.586294 | SILUV | 1.560383 | 67.7 |
| 43 | −8639.553294 | 3.656549 | | | 60.2 |
| 44 | 670.066979 | 34.418290 | SILUV | 1.560383 | 50.4 |
| 45 | 0.000000 | 3.000000 | | | 26.0 |
| 46 | 0.000000 | 0.000000 | | | 18.0 |

TABLE 1A

Aspheric Constants

| | SURFACE | | | | |
|---|---|---|---|---|---|
| | 2 | 7 | 12 | 13 | 16 |
| K | 0 | 0 | 0 | −4.944420 | 1.152610 |
| C1 | 5.636151E−08 | −1.097786E−07 | 3.041551E−08 | 6.327056E−10 | −2.951894E−09 |
| C2 | 1.873219E−12 | −2.163738E−12 | 6.018515E−14 | 1.065525E−13 | −1.274901E−14 |
| C3 | 2.022914E−16 | 3.115796E−16 | 3.400950E−16 | −3.546320E−19 | −1.977806E−19 |
| C4 | −6.176161E−20 | −7.008118E−20 | 9.273678E−21 | 6.341685E−23 | 7.263110E−26 |
| C5 | 9.316153E−24 | 6.095765E−24 | −3.203609E−24 | −4.415435E−27 | −6.405130E−29 |
| C6 | −5.218617E−28 | −2.754054E−28 | 1.609754E−27 | 7.451210E−32 | −2.161459E−34 |

| | SURFACE | | | | |
|---|---|---|---|---|---|
| | 18 | 21 | 27 | 36 | 41 | 43 |
| K | 0 | 0 | 0 | 0 | 0 | 0 |
| C1 | 8.597688E−09 | 2.053140E−07 | −1.232095E−07 | −1.213092E−07 | 4.494895E−08 | −4.449397E−08 |
| C2 | 4.317017E−13 | −1.704884E−11 | 4.702556E−12 | 2.126549E−12 | 2.362734E−12 | 3.189166E−11 |
| C3 | −2.534874E−17 | 1.112136E−15 | −5.420948E−16 | 2.598408E−16 | −1.913349E−16 | −3.719674E−15 |
| C4 | 2.181358E−21 | 7.366407E−20 | 2.697397E−20 | −4.151973E−21 | −7.290154E−21 | 1.002864E−19 |
| C5 | −1.307661E−25 | −2.112129E−23 | −1.786488E−24 | −2.620839E−25 | 1.422000E−24 | 3.652908E−23 |
| C6 | 2.771039E−30 | 1.429298E−27 | 4.885048E−29 | 1.442695E−29 | −9.312451E−29 | −1.673508E−27 |

TABLE 2

(k346) NA = 1.20; y' = 18.75 mm; l = 193 nm

| SURFACE | RADIUS | THICKNESS | MATERIAL | INDEX | SEMIDIAM. |
|---|---|---|---|---|---|
| 0 | 0.000000 | 49.406069 | | | 75.0 |
| 1 | −9166.399958 | 38.238341 | SILUV | 1.560383 | 90.5 |
| 2 | −153.729452 | 0.994270 | | | 92.5 |
| 3 | 1100.351575 | 9.994945 | SILUV | 1.560383 | 91.1 |
| 4 | 178.588935 | 44.615401 | | | 89.4 |
| 5 | 207.481487 | 35.336470 | SILUV | 1.560383 | 101.8 |
| 6 | 3752.047355 | 4.628064 | | | 101.3 |
| 7 | 209.596257 | 47.440249 | SILUV | 1.560383 | 99.5 |
| 8 | −346.561457 | 34.436338 | | | 97.2 |
| 9 | 571.380758 | 17.463931 | SILUV | 1.560383 | 67.9 |
| 10 | −405.171799 | 286.066646 | | | 64.2 |
| 11 | −750.754611 | −255.085427 | REFL | | 162.1 |
| 12 | 403.387547 | 255.085427 | REFL | | 212.1 |
| 13 | −750.754611 | −255.085427 | REFL | | 33.0 |
| 14 | 403.387547 | 286.080397 | REFL | | 211.9 |
| 15 | 192.280046 | 58.189700 | SILUV | 1.560383 | 145.0 |
| 16 | 807.250579 | 0.996110 | | | 140.8 |
| 17 | 183.902303 | 27.518657 | SILUV | 1.560383 | 121.2 |
| 18 | 247.552570 | 68.983954 | | | 114.4 |
| 19 | 1917.209778 | 9.992325 | SILUV | 1.560383 | 83.8 |
| 20 | 131.838939 | 17.720661 | | | 72.3 |
| 21 | 328.832553 | 9.987820 | SILUV | 1.560383 | 71.5 |
| 22 | 103.232265 | 44.099503 | | | 66.2 |
| 23 | −185.196874 | 9.994349 | SILUV | 1.560383 | 66.8 |
| 24 | 236.161359 | 21.960044 | | | 78.4 |
| 25 | −760.255007 | 25.328635 | SILUV | 1.560383 | 82.7 |
| 26 | −208.055237 | 17.440625 | | | 88.7 |
| 27 | −437.391946 | 25.517021 | SILUV | 1.560383 | 105.1 |
| 28 | −228.062403 | 0.991341 | | | 110.1 |
| 29 | −907.414065 | 30.879725 | SILUV | 1.560383 | 118.5 |
| 30 | −246.888681 | 0.984171 | | | 122.4 |
| 31 | 514.343713 | 43.408753 | SILUV | 1.560383 | 138.1 |
| 32 | −671.677336 | 0.984138 | | | 138.9 |
| 33 | 507.416430 | 64.740393 | SILUV | 1.560383 | 139.0 |
| 34 | −287.355201 | 7.522120 | | | 138.1 |
| 35 | −261.708965 | 9.986806 | SILUV | 1.560383 | 134.3 |
| 36 | −377.715249 | −28.247528 | | | 133.4 |
| 37 | 0.000000 | 29.218927 | | | 134.1 |
| 38 | 208.537431 | 50.262824 | SILUV | 1.560383 | 121.6 |
| 39 | −1259.248631 | 0.958874 | | | 118.5 |
| 40 | 182.316275 | 24.372748 | SILUV | 1.560383 | 97.2 |
| 41 | 352.265462 | 0.958125 | | | 91.0 |
| 42 | 81.020983 | 38.967233 | SILUV | 1.560383 | 69.9 |
| 43 | 115.808516 | 0.905970 | | | 55.7 |
| 44 | 71.358960 | 39.416927 | SILUV | 1.560383 | 48.5 |

TABLE 2-continued (k346) NA = 1.20; y' = 18.75 mm; l = 193 nm

| SURFACE | RADIUS | THICKNESS | MATERIAL | INDEX | SEMIDIAM. |
|---|---|---|---|---|---|
| 45 | 0.000000 | 3.000000 | H2O | 1.436677 | 23.4 |
| 46 | 0.000000 | 0.000000 | | | 18.8 |

TABLE 2A

Aspheric Constants

| | SURFACE | | | | |
|---|---|---|---|---|---|
| | 2 | 8 | 10 | 11 | 12 |
| K | 0 | 0 | 0 | 0.735412 | −3.942570 |
| C1 | 4.113073E−08 | 2.651762E−08 | 8.766383E−08 | 1.994628E−09 | 6.860575E−09 |
| C2 | −9.131510E−13 | −1.538897E−12 | 1.806673E−12 | 6.100868E−14 | −3.896208E−14 |
| C3 | −7.483645E−17 | 7.408337E−17 | 4.167805E−16 | 2.643089E−18 | 8.403949E−19 |
| C4 | −1.458465E−20 | −1.173136E−21 | −1.166719E−19 | −1.508388E−22 | −1.542509E−23 |
| C5 | 3.435626E−24 | 3.692231E−26 | 2.516061E−23 | 4.125226E−27 | 2.119481E−28 |
| C6 | −1.306679E−28 | −1.318726E−30 | −1.611960E−27 | −4.785473E−32 | −1.307931E−33 |

| | SURFACE | | | | |
|---|---|---|---|---|---|
| | 15 | 19 | 23 | 29 | 38 |
| K | 0 | 0 | 0 | 0 | 0 |
| C1 | −5.287915E−09 | −2.621755E−08 | −1.891399E−07 | −1.579469E−08 | −1.362529E−08 |
| C2 | −3.453401E−13 | −5.650769E−12 | 1.244581E−12 | −3.429353E−13 | −3.846171E−13 |
| C3 | 3.101848E−18 | −1.802784E−17 | 1.660493E−16 | −3.726596E−18 | −2.122114E−18 |
| C4 | −5.465009E−22 | 3.205794E−20 | −1.008165E−19 | 1.418116E−21 | 1.620651E−21 |
| C5 | 2.272553E−26 | −4.660128E−24 | 2.247809E−23 | −1.113355E−25 | −1.573066E−25 |
| C6 | −1.134248E−31 | 2.294424E−28 | −1.650057E−27 | 4.306054E−30 | 2.750724E−30 |

| | SURFACE | |
|---|---|---|
| | 41 | 43 |
| K | 0 | 0 |
| C1 | −5.670668E−09 | 1.272117E−07 |
| C2 | 2.475352E−12 | −9.198844E−12 |
| C3 | 2.220023E−16 | −4.352763E−15 |
| C4 | −1.344986E−20 | 1.298277E−19 |
| C5 | 5.784083E−25 | 2.997692E−23 |
| C6 | −6.001621E−30 | 2.578442E−27 |

TABLE 3

(k347) NA = 0.93; y' = 18 mm; l = 193 nm

| SURFACE | RADIUS | THICKNESS | MATERIAL | INDEX | SEMIDIAM. |
|---|---|---|---|---|---|
| 0 | 0.000000 | 68.603258 | | | 72.0 |
| 1 | −408.943284 | 29.984305 | SILUV | 1.560383 | 86.3 |
| 2 | −138.631230 | 7.638570 | | | 88.6 |
| 3 | 1057.275375 | 9.999141 | SILUV | 1.560383 | 88.3 |
| 4 | 169.493075 | 0.999474 | | | 87.2 |
| 5 | 146.241876 | 36.279371 | SILUV | 1.560383 | 89.6 |
| 6 | 899.075823 | 41.361172 | | | 88.6 |
| 7 | 138.458918 | 38.027443 | SILUV | 1.560383 | 82.0 |
| 8 | −967.665991 | 28.311353 | | | 78.9 |
| 9 | 1054.940057 | 16.309754 | SILUV | 1.560383 | 62.7 |
| 10 | −311.911881 | 292.057444 | | | 59.4 |
| 11 | −627.753488 | −261.060539 | REFL | | 153.7 |
| 12 | 441.959274 | 261.060539 | REFL | | 183.0 |
| 13 | −627.753488 | −261.060539 | REFL | | 27.7 |
| 14 | 441.959274 | 292.059460 | REFL | | 186.3 |
| 15 | 205.014892 | 58.834004 | SILUV | 1.560383 | 143.6 |
| 16 | 1527.681508 | 0.999548 | | | 140.0 |
| 17 | 179.557630 | 31.983248 | SILUV | 1.560383 | 121.3 |
| 18 | 275.332154 | 71.621596 | | | 115.1 |
| 19 | 560.468433 | 9.999475 | SILUV | 1.560383 | 78.7 |
| 20 | 133.696407 | 8.598301 | | | 68.4 |
| 21 | 165.765903 | 9.999414 | SILUV | 1.560383 | 67.2 |

TABLE 3-continued (k347) NA = 0.93; y' = 18 mm; l = 193 nm

| SURFACE | RADIUS | THICKNESS | MATERIAL | INDEX | SEMIDIAM. |
|---|---|---|---|---|---|
| 22 | 121.578160 | 29.441726 | | | 62.5 |
| 23 | −238.186829 | 9.999489 | SILUV | 1.560383 | 61.6 |
| 24 | 135.350984 | 24.712828 | | | 60.2 |
| 25 | −447.047790 | 13.469280 | SILUV | 1.560383 | 61.2 |
| 26 | −207.111334 | 27.978885 | | | 63.7 |
| 27 | −1125.479273 | 9.999409 | SILUV | 1.560383 | 71.4 |
| 28 | 253.420824 | 18.151518 | | | 75.2 |
| 29 | −1089.266231 | 30.259287 | SILUV | 1.560383 | 77.2 |
| 30 | −152.385572 | 0.999516 | | | 80.5 |
| 31 | 341.033510 | 18.367309 | SILUV | 1.560383 | 86.9 |
| 32 | 1309.841533 | 1.771155 | | | 87.1 |
| 33 | 343.807008 | 112.944225 | SILUV | 1.560383 | 87.8 |
| 34 | −247.281775 | −38.706921 | | | 90.1 |
| 35 | 0.000000 | 39.706120 | | | 90.8 |
| 36 | 319.821449 | 27.485771 | SILUV | 1.560383 | 89.4 |
| 37 | −530.824615 | 0.999462 | | | 88.6 |
| 38 | 112.749413 | 72.327858 | SILUV | 1.560383 | 79.5 |
| 39 | 1002.193149 | 0.998886 | | | 60.0 |
| 40 | 77.486012 | 54.553127 | SILUV | 1.560383 | 48.7 |
| 41 | 0.000000 | 3.000000 | H2O | 1.436677 | 20.6 |
| 42 | 0.000000 | 0.000000 | | | 18.0 |

TABLE 3A

Aspheric Constants

| | SURFACE | | | | |
|---|---|---|---|---|---|
| | 2 | 8 | 10 | 11 | 14 |
| K | 0 | 0 | 0 | −5.696560 | 1.402530 |
| C1 | 4.245204E−08 | 6.728680E−08 | 8.599129E−08 | −1.652043E−11 | −2.329327E−09 |
| C2 | 3.275452E−13 | −1.804830E−12 | 3.441187E−12 | 6.039934E−14 | −8.180617E−15 |
| C3 | −5.375944E−17 | −2.745623E−16 | 5.553510E−16 | 2.856349E−19 | −1.087281E−19 |
| C4 | 1.193536E−20 | 5.074471E−20 | −1.446982E−19 | −2.932213E−23 | −5.309105E−24 |
| C5 | 2.623696E−25 | −4.427512E−24 | 3.087089E−23 | 5.280228E−28 | 4.502858E−29 |
| C6 | −8.285178E−29 | 2.778796E−28 | −3.155499E−27 | −3.608134E−33 | −5.392311E−34 |

| | SURFACE | | | | |
|---|---|---|---|---|---|
| | 16 | 19 | 25 | 36 | 39 |
| K | 0 | 0 | 0 | 0 | 0 |
| C1 | 1.237159E−08 | −1.733807E−08 | −1.626822E−07 | −3.772925E−08 | 3.680797E−08 |
| C2 | −6.673906E−14 | −5.617338E−12 | −6.564586E−13 | −6.206460E−13 | 6.034720E−12 |
| C3 | −2.428559E−19 | −2.832349E−16 | −3.244387E−16 | 1.076531E−17 | −5.564205E−16 |
| C4 | −6.892915E−22 | 5.707828E−20 | 3.070594E−20 | −2.192558E−22 | 9.977675E−20 |
| C5 | 2.809997E−26 | −7.299044E−24 | −6.346113E−24 | −9.819825E−27 | −1.462958E−23 |
| C6 | −3.324901E−31 | 3.783869E−28 | 4.434802E−28 | −5.401628E−30 | 1.028916E−27 |

TABLE 4

(k348) NA = 1.55; y' = 15.75 mm; l = 193 nm

| SURFACE | RADIUS | THICKNESS | MATERIAL | INDEX | SEMIDIAM. |
|---|---|---|---|---|---|
| 0 | 0.000000 | 40.994338 | | | 63.0 |
| 1 | 1106.107493 | 32.675621 | SILUV | 1.560383 | 81.5 |
| 2 | −210.586924 | 17.411687 | | | 83.7 |
| 3 | 230.056603 | 9.999252 | SILUV | 1.560383 | 87.4 |
| 4 | 130.334576 | 17.374429 | | | 85.0 |
| 5 | 216.012438 | 27.918601 | SILUV | 1.560383 | 86.6 |
| 6 | −1277.394417 | 0.999281 | | | 87.2 |
| 7 | 229.686765 | 35.257008 | SILUV | 1.560383 | 90.1 |
| 8 | −589.430608 | 25.901086 | | | 89.5 |
| 9 | 1263.841608 | 41.815322 | SILUV | 1.560383 | 82.9 |
| 10 | −325.287810 | 0.995249 | | | 79.2 |
| 11 | 15617.372508 | 16.011958 | SILUV | 1.560383 | 71.2 |
| 12 | −278.461461 | 259.704520 | | | 67.8 |
| 13 | −586.915961 | −228.706060 | REFL | | 141.3 |
| 14 | 397.557305 | 228.706060 | REFL | | 156.4 |

TABLE 4-continued (k348) NA = 1.55; y' = 15.75 mm; l = 193 nm

| SURFACE | RADIUS | THICKNESS | MATERIAL | INDEX | SEMIDIAM. |
|---|---|---|---|---|---|
| 15 | −586.915961 | −228.706060 | REFL | | 41.2 |
| 16 | 397.557305 | 259.704206 | REFL | | 167.3 |
| 17 | 187.918116 | 67.008009 | SILUV | 1.560383 | 135.4 |
| 18 | −1190.301819 | 0.999404 | | | 133.2 |
| 19 | 160.358218 | 14.239341 | SILUV | 1.560383 | 110.1 |
| 20 | 162.138328 | 79.537794 | | | 104.1 |
| 21 | −412.994328 | 10.000619 | SILUV | 1.560383 | 89.0 |
| 22 | 136.719519 | 17.701578 | | | 80.9 |
| 23 | 184.714762 | 9.999745 | SILUV | 1.560383 | 82.7 |
| 24 | 132.825528 | 53.929433 | | | 80.6 |
| 25 | −205.049374 | 9.999286 | SILUV | 1.560383 | 81.6 |
| 26 | 459.638323 | 14.233960 | | | 99.3 |
| 27 | 543.727853 | 33.822493 | SILUV | 1.560383 | 111.2 |
| 28 | −406.729138 | 33.025210 | | | 116.5 |
| 29 | −353.889904 | 46.853961 | SILUV | 1.560383 | 132.0 |
| 30 | −184.752097 | 0.999733 | | | 138.8 |
| 31 | −811.415342 | 33.920020 | SILUV | 1.560383 | 152.9 |
| 32 | −280.484766 | 0.999298 | | | 156.7 |
| 33 | 873.831942 | 48.178453 | SILUV | 1.560383 | 172.1 |
| 34 | −586.122552 | 0.999182 | | | 172.8 |
| 35 | 290.904053 | 89.486535 | SILUV | 1.560383 | 173.9 |
| 36 | −599.221193 | 5.836768 | | | 171.4 |
| 37 | 0.000000 | −4.842659 | | | 154.8 |
| 38 | 241.567588 | 50.827268 | SILUV | 1.560383 | 140.0 |
| 39 | −5650.000693 | 0.992244 | | | 135.4 |
| 40 | 278.777070 | 24.082301 | SILUV | 1.560383 | 112.0 |
| 41 | 984.748000 | 0.992513 | | | 104.9 |
| 42 | 113.538811 | 15.263498 | SILUV | 1.560383 | 79.7 |
| 43 | 92.480580 | 0.989393 | | | 67.5 |
| 44 | 90.172393 | 70.003375 | LUAG | 2.143547 | 66.5 |
| 45 | 0.000000 | 3.000000 | IMMO | 1.650000 | 23.9 |
| 46 | 0.000000 | 0.000000 | | | 15.8 |

TABLE 4A

Aspheric Constants

| | SURFACE | | | | |
|---|---|---|---|---|---|
| | 2 | 6 | 10 | 12 | 13 |
| K | 0 | 0 | 0 | 0 | 0.229706 |
| C1 | −8.070856E−08 | 5.601392E−08 | −2.383361E−08 | 8.120932E−08 | 1.356143E−09 |
| C2 | 1.713390E−12 | 9.711772E−13 | −1.066716E−11 | 9.893101E−12 | 3.096592E−13 |
| C3 | 1.829480E−15 | −5.124800E−16 | −4.993554E−16 | 2.153752E−16 | −1.274775E−17 |
| C4 | −3.275079E−19 | 9.007880E−20 | 3.346416E−19 | −1.918238E−19 | 3.927922E−22 |
| C5 | 2.472062E−23 | −8.286547E−24 | −3.725821E−23 | 1.277771E−23 | −6.994797E−27 |
| C6 | −8.901465E−28 | 3.606734E−28 | 1.428857E−27 | 6.744839E−28 | 4.740018E−32 |

| | SURFACE | | | | |
|---|---|---|---|---|---|
| | 16 | 17 | 20 | 21 | 23 |
| K | −4.097710 | 0 | 0 | 0 | 0 |
| C1 | 6.969985E−09 | 8.568249E−10 | 4.720340E−08 | 4.231537E−08 | 1.593608E−08 |
| C2 | 2.593838E−14 | −1.554720E−12 | −1.067081E−14 | −5.072983E−12 | 5.495669E−12 |
| C3 | −1.962065E−18 | −1.167810E−17 | −2.745603E−16 | −7.251044E−16 | −9.665578E−17 |
| C4 | 4.636382E−23 | 1.836010E−21 | −1.125203E−20 | 1.002309E−19 | 4.719829E−20 |
| C5 | −5.286127E−28 | −2.947270E−26 | 9.528523E−25 | −2.107069E−24 | −1.693410E−23 |
| C6 | 1.969073E−33 | −2.402154E−31 | 5.868360E−30 | −1.376736E−28 | 1.085387E−27 |

| | SURFACE | | | | |
|---|---|---|---|---|---|
| | 25 | 27 | 29 | 31 | 34 |
| K | 0 | 0 | 0 | 0 | 0 |
| C1 | −1.098480E−07 | −2.971317E−08 | −1.192179E−08 | −1.907564E−08 | 3.160469E−09 |
| C2 | −2.490833E−12 | −4.144434E−13 | 7.470071E−13 | −1.319948E−13 | 2.590213E−14 |
| C3 | −1.067368E−16 | 2.701729E−17 | −3.081111E−17 | 1.025087E−17 | 5.318553E−18 |
| C4 | 5.858593E−21 | 1.290707E−21 | −1.012122E−21 | 4.813498E−22 | 1.728543E−23 |
| C5 | −1.917977E−24 | −3.123227E−25 | 1.152292E−25 | −3.088777E−26 | −1.005162E−26 |
| C6 | 2.992063E−28 | 1.527347E−29 | −2.046278E−30 | 3.495974E−31 | 1.871717E−31 |

TABLE 4A-continued

Aspheric Constants

| | SURFACE | | |
|---|---|---|---|
| | 36 | 38 | 41 |
| K  | 0 | 0 | 0 |
| C1 | 2.011955E−09 | −1.195295E−08 | 1.156486E−08 |
| C2 | 8.939646E−14 | −2.195566E−13 | 1.627990E−12 |
| C3 | −3.499205E−18 | 1.048937E−17 | −2.131741E−17 |
| C4 | 2.525806E−22 | 7.952442E−24 | 3.407127E−21 |
| C5 | −8.151223E−27 | 9.199605E−27 | 3.663907E−26 |
| C6 | 8.109723E−32 | −1.182538E−30 | −4.850446E−30 |

TABLE 5

(k346) NA = 1.20; y' = 18.75 mm; l = 193 nm

| SURFACE | RADIUS | THICKNESS | MATERIAL | INDEX | SEMIDIAM. |
|---|---|---|---|---|---|
| 0 | 0.000000 | 49.406069 | | | 75.0 |
| 1 | −9166.399958 | 38.238341 | SILUV | 1.560383 | 90.5 |
| 2 | −153.729452 | 0.994270 | | | 92.5 |
| 3 | 1100.351575 | 9.994945 | SILUV | 1.560383 | 91.1 |
| 4 | 178.588935 | 44.615401 | | | 89.4 |
| 5 | 207.481487 | 35.336470 | SILUV | 1.560383 | 101.8 |
| 6 | 3752.047355 | 4.628064 | | | 101.3 |
| 7 | 209.596257 | 47.440249 | SILUV | 1.560383 | 99.5 |
| 8 | −346.561457 | 34.436338 | | | 97.2 |
| 9 | 571.380758 | 17.463931 | SILUV | 1.560383 | 67.9 |
| 10 | −405.171799 | 286.066646 | | | 64.2 |
| 11 | −750.754611 | −255.085427 | REFL | | 162.1 |
| 12 | 403.387547 | 255.085427 | REFL | | 212.1 |
| 13 | −750.754611 | −255.085427 | REFL | | 33.0 |
| 14 | 403.387547 | 286.080397 | REFL | | 211.9 |
| 15 | 192.280046 | 58.189700 | SILUV | 1.560383 | 145.0 |
| 16 | 807.250579 | 0.996110 | | | 140.8 |
| 17 | 183.902303 | 27.518657 | SILUV | 1.560383 | 121.2 |
| 18 | 247.552570 | 68.983954 | | | 114.4 |
| 19 | 1917.209778 | 9.992325 | SILUV | 1.560383 | 83.8 |
| 20 | 131.838939 | 17.720661 | | | 72.3 |
| 21 | 328.832553 | 9.987820 | SILUV | 1.560383 | 71.5 |
| 22 | 103.232265 | 44.099503 | | | 66.2 |
| 23 | −185.196874 | 9.994349 | SILUV | 1.560383 | 66.8 |
| 24 | 236.161359 | 21.960044 | | | 78.4 |
| 25 | −760.255007 | 25.328635 | SILUV | 1.560383 | 82.7 |
| 26 | −208.055237 | 17.440625 | | | 88.7 |
| 27 | −437.391946 | 25.517021 | SILUV | 1.560383 | 105.1 |
| 28 | −228.062403 | 0.991341 | | | 110.1 |
| 29 | −907.414065 | 30.879725 | SILUV | 1.560383 | 118.5 |
| 30 | −246.888681 | 0.984171 | | | 122.4 |
| 31 | 514.343713 | 43.408753 | SILUV | 1.560383 | 138.1 |
| 32 | −671.677336 | 0.984138 | | | 138.9 |
| 33 | 507.416430 | 64.740393 | SILUV | 1.560383 | 139.0 |
| 34 | −287.355201 | 7.522120 | | | 138.1 |
| 35 | −261.708965 | 9.986806 | SILUV | 1.560383 | 134.3 |
| 36 | −377.715249 | −28.247528 | | | 133.4 |
| 37 | 0.000000 | 29.218927 | | | 134.1 |
| 38 | 208.537431 | 50.262824 | SILUV | 1.560383 | 121.6 |
| 39 | −1259.248631 | 0.958874 | | | 118.5 |
| 40 | 182.316275 | 24.372748 | SILUV | 1.560383 | 97.2 |
| 41 | 352.265462 | 0.958125 | | | 91.0 |
| 42 | 81.020983 | 38.967233 | SILUV | 1.560383 | 69.9 |
| 43 | 115.808516 | 0.905970 | | | 55.7 |
| 44 | 71.358960 | 39.416927 | SILUV | 1.560383 | 48.5 |
| 45 | 0.000000 | 3.000000 | H2O | 1.436677 | 23.4 |
| 46 | 0.000000 | 0.000000 | | | 18.8 |

TABLE 5A

Aspheric Constants

| | SURFACE | | | | |
|---|---|---|---|---|---|
| | 2 | 8 | 10 | 11 | 12 |
| K | 0 | 0 | 0 | 0.735412 | −3.942570 |
| C1 | 4.113073E−08 | 2.651762E−08 | 8.766383E−08 | 1.994628E−09 | 6.860575E−09 |
| C2 | −9.131510E−13 | −1.538897E−12 | 1.806673E−12 | 6.100868E−14 | −3.896208E−14 |
| C3 | −7.483645E−17 | 7.408337E−17 | 4.167805E−16 | 2.643089E−18 | 8.403949E−19 |
| C4 | −1.458465E−20 | −1.173136E−21 | −1.166719E−19 | −1.508388E−22 | −1.542509E−23 |
| C5 | 3.435626E−24 | 3.692231E−26 | 2.516061E−23 | 4.125226E−27 | 2.119481E−28 |
| C6 | −1.306679E−28 | −1.318726E−30 | −1.611960E−27 | −4.785473E−32 | −1.307931E−33 |

| | SURFACE | | | | |
|---|---|---|---|---|---|
| | 15 | 19 | 23 | 29 | 38 |
| K | 0 | 0 | 0 | 0 | 0 |
| C1 | −5.287915E−09 | −2.621755E−08 | −1.891399E−07 | −1.579469E−08 | −1.362529E−08 |
| C2 | −3.453401E−13 | −5.650769E−12 | 1.244581E−13 | −3.429353E−13 | −3.846171E−13 |
| C3 | 3.101848E−18 | −1.802784E−17 | 1.660493E−16 | −3.726596E−18 | −2.122114E−18 |
| C4 | −5.465009E−22 | 3.205794E−20 | −1.008165E−19 | 1.418116E−21 | 1.620651E−21 |
| C5 | 2.272553E−26 | −4.660128E−24 | 2.247809E−23 | −1.113355E−25 | −1.573066E−25 |
| C6 | −1.134248E−31 | 2.294424E−28 | −1.650057E−27 | 4.306054E−30 | 2.750724E−30 |

| | SURFACE | |
|---|---|---|
| | 41 | 43 |
| K | 0 | 0 |
| C1 | −5.670668E−09 | 1.272117E−07 |
| C2 | 2.475352E−12 | −9.198844E−12 |
| C3 | 2.220023E−16 | −4.352763E−15 |
| C4 | −1.344986E−20 | 1.298277E−19 |
| C5 | 5.784083E−25 | 2.997692E−23 |
| C6 | −6.001621E−30 | 2.578442E−27 |

TABLE 6

| (k348) NA = 1.55; y' = 15.75 mm; l = 193 nm | | | | | |
|---|---|---|---|---|---|
| SURFACE | RADIUS | THICKNESS | MATERIAL | INDEX | SEMIDIAM. |
| 0 | 0.000000 | 40.994338 | | | 63.0 |
| 1 | 1106.107493 | 32.675621 | SILUV | 1.560383 | 81.5 |
| 2 | −210.586924 | 17.411687 | | | 83.7 |
| 3 | 230.056603 | 9.999252 | SILUV | 1.560383 | 87.4 |
| 4 | 130.334576 | 17.374429 | | | 85.0 |
| 5 | 216.012438 | 27.918601 | SILUV | 1.560383 | 86.6 |
| 6 | −1277.394417 | 0.999281 | | | 87.2 |
| 7 | 229.686765 | 35.257008 | SILUV | 1.560383 | 90.1 |
| 8 | −589.430608 | 25.901086 | | | 89.5 |
| 9 | 1263.841608 | 41.815322 | SILUV | 1.560383 | 82.9 |
| 10 | −325.287810 | 0.995249 | | | 79.2 |
| 11 | 15617.372508 | 16.011958 | SILUV | 1.560383 | 71.2 |
| 12 | −278.461461 | 259.704520 | | | 67.8 |
| 13 | −586.915961 | −228.706060 | REFL | | 141.3 |
| 14 | 397.557305 | 228.706060 | REFL | | 156.4 |
| 15 | −586.915961 | −228.706060 | REFL | | 41.2 |
| 16 | 397.557305 | 259.704206 | REFL | | 167.3 |
| 17 | 187.918116 | 67.008009 | SILUV | 1.560383 | 135.4 |
| 18 | −1190.301819 | 0.999404 | | | 133.2 |
| 19 | 160.358218 | 14.239341 | SILUV | 1.560383 | 110.1 |
| 20 | 162.138328 | 79.537794 | | | 104.1 |
| 21 | −412.994328 | 10.000619 | SILUV | 1.560383 | 89.0 |
| 22 | 136.719519 | 17.701578 | | | 80.9 |
| 23 | 184.714762 | 9.999745 | SILUV | 1.560383 | 82.7 |
| 24 | 132.825528 | 53.929433 | | | 80.6 |
| 25 | −205.049374 | 9.999286 | SILUV | 1.560383 | 81.6 |
| 26 | 459.638323 | 14.233960 | | | 99.3 |
| 27 | 543.727853 | 33.822493 | SILUV | 1.560383 | 111.2 |
| 28 | −406.729138 | 33.025210 | | | 116.5 |
| 29 | −353.889904 | 46.853961 | SILUV | 1.560383 | 132.0 |
| 30 | −184.752097 | 0.999733 | | | 138.8 |
| 31 | −811.415342 | 33.920020 | SILUV | 1.560383 | 152.9 |
| 32 | −280.484766 | 0.999298 | | | 156.7 |

TABLE 6-continued (k348) NA = 1.55; y' = 15.75 mm; l = 193 nm

| SURFACE | RADIUS | THICKNESS | MATERIAL | INDEX | SEMIDIAM. |
|---|---|---|---|---|---|
| 33 | 873.831942 | 48.178453 | SILUV | 1.560383 | 172.1 |
| 34 | −586.122552 | 0.999182 | | | 172.8 |
| 35 | 290.904053 | 89.486535 | SILUV | 1.560383 | 173.9 |
| 36 | −599.221193 | 5.836768 | | | 171.4 |
| 37 | 0.000000 | −4.842659 | | | 154.8 |
| 38 | 241.567588 | 50.827268 | SILUV | 1.560383 | 140.0 |
| 39 | −5650.000693 | 0.992244 | | | 135.4 |
| 40 | 278.777070 | 24.082301 | SILUV | 1.560383 | 112.0 |
| 41 | 984.748000 | 0.992513 | | | 104.9 |
| 42 | 113.538811 | 15.263498 | SILUV | 1.560383 | 79.7 |
| 43 | 92.480580 | 0.989393 | | | 67.5 |
| 44 | 90.172393 | 70.003375 | LUAG | 2.143547 | 66.5 |
| 45 | 0.000000 | 3.000000 | IMMO | 1.650000 | 23.9 |
| 46 | 0.000000 | 0.000000 | | | 15.8 |

TABLE 6A

Aspheric Constants

| | SURFACE | | | | |
|---|---|---|---|---|---|
| | 2 | 6 | 10 | 12 | 13 |
| K | 0 | 0 | 0 | 0 | 0.229706 |
| C1 | −8.070856E−08 | 5.601392E−08 | −2.383361E−08 | 8.120932E−08 | 1.356143E−09 |
| C2 | 1.713390E−12 | 9.711772E−13 | −1.066716E−11 | 9.893101E−12 | 3.096592E−13 |
| C3 | 1.829480E−15 | −5.124800E−16 | −4.993554E−16 | 2.153752E−16 | −1.274775E−17 |
| C4 | −3.275079E−19 | 9.007880E−20 | 3.346416E−19 | −1.918238E−19 | 3.927922E−22 |
| C5 | 2.472062E−23 | −8.285647E−24 | −3.725821E−23 | 1.277771E−23 | −6.994797E−27 |
| C6 | −8.901465E−28 | 3.606734E−28 | 1.428857E−27 | 6.744839E−28 | 4.740018E−32 |

| | SURFACE | | | | |
|---|---|---|---|---|---|
| | 16 | 17 | 20 | 21 | 23 |
| K | −4.097710 | 0 | 0 | 0 | 0 |
| C1 | 6.969985E−09 | 8.568249E−10 | 4.720340E−08 | 4.231537E−08 | 1.593608E−08 |
| C2 | 2.593838E−14 | −1.554720E−12 | −1.067081E−14 | −5.072983E−12 | 5.495669E−12 |
| C3 | −1.962065E−18 | −1.167810E−17 | −2.745603E−16 | −7.251044E−16 | −9.665578E−17 |
| C4 | 4.636382E−23 | 1.836010E−21 | −1.125203E−20 | 1.002309E−19 | 4.719829E−20 |
| C5 | −5.286127E−28 | −2.947270E−26 | 9.528523E−25 | −2.107069E−24 | −1.693410E−23 |
| C6 | 1.969073E−33 | −2.402154E−31 | 5.868360E−30 | −1.376736E−28 | 1.085387E−27 |

| | SURFACE | | | | |
|---|---|---|---|---|---|
| | 25 | 27 | 29 | 31 | 34 |
| K | 0 | 0 | 0 | 0 | 0 |
| C1 | −1.098480E−07 | −2.971317E−08 | −1.192179E−08 | −1.907564E−08 | 3.160469E−09 |
| C2 | −2.490833E−12 | −4.144434E−13 | 7.470071E−13 | −1.319948E−13 | 2.590213E−14 |
| C3 | −1.067368E−16 | 2.701729E−17 | −3.081111E−17 | 1.025087E−17 | 5.318553E−18 |
| C4 | 5.858593E−21 | 1.290707E−21 | −1.012122E−21 | 4.813498E−22 | 1.728543E−23 |
| C5 | −1.917977E−24 | −3.123227E−25 | 1.152292E−25 | −3.088777E−26 | −1.005162E−26 |
| C6 | 2.992063E−28 | 1.527347E−29 | −2.046278E−30 | 3.495974E−31 | 1.871717E−31 |

| | SURFACE | | |
|---|---|---|---|
| | 36 | 38 | 41 |
| K | 0 | 0 | 0 |
| C1 | 2.011955E−09 | −1.195295E−08 | 1.156486E−08 |
| C2 | 8.939646E−14 | −2.195566E−13 | 1.627990E−12 |
| C3 | −3.499205E−18 | 1.048937E−17 | −2.131741E−17 |
| C4 | 2.525806E−22 | 7.952442E−24 | 3.407127E−21 |
| C5 | −8.151223E−27 | 9.199605E−27 | 3.663907E−26 |
| C6 | 8.109723E−32 | −1.182538E−30 | −4.850446E−30 |

What is claimed is:

1. A system, comprising:
   a catadioptric projection objective configured to image a pattern from an object field arranged in an object surface of the catadioptric projection objective onto an image field arranged in an image surface of the catadioptric projection objective comprising:
   a first objective part configured to image the pattern from the object surface into a first intermediate image, and having a first pupil surface;
   a second objective part configured to image the first intermediate image into a second intermediate image, and having a second pupil surface optically conjugate to the first pupil surface;
   a third objective part configured to image the second intermediate image into the image surface, and having a third pupil surface optically conjugate to the first and second pupil surface;
   a pupil mirror having a reflective pupil mirror surface positioned at or close to one of the first, second and third pupil surface; and
   a pupil mirror manipulator operatively connected to the pupil mirror and configured to vary a shape of the pupil mirror surface, and
   a control system including a pupil mirror control unit configured to control the pupil mirror manipulator,
   wherein:
   the pupil mirror control unit comprises or is communicatively connected to a memory storing data representing parameters of a simulation model of the catadioptric projection objective;
   during operation the control system derives at least one input signal for the control circuit from the data stored in the memory;
   the catadioptric projection objective has an aperture stop configured to adjust a diameter of an aperture as desired, where a maximum diameter of the aperture of the aperture stop is at least twice as large as a diameter $D_{PM}$ of the pupil mirror, and
   a mirror group includes a mirror pair consisting of two concave mirrors having mirror surfaces sharing a common surface of curvature provided on a common substrate, wherein one of the concave mirrors is the pupil mirror having a reflecting pupil mirror surface configured to be deformable by the pupil mirror manipulator and the other concave mirror has a rigid reflective surface separate from the pupil mirror surface.

2. The system according to claim 1, wherein at least one intermediate image is formed between the object surface and the pupil mirror.

3. The system according to claim 2, wherein the pupil mirror is arranged in the second objective part at or close to the second pupil surface.

4. The system according to claim 3, wherein at least one lens is provided in the second objective part in addition to the pupil mirror.

5. The system according to claim 3, wherein the first objective part is a purely refractive objective part and the third objective part is a purely refractive objective part.

6. The system according to claim 3, wherein the second objective part is purely reflective.

7. The system according to claim 6, wherein the first objective part is a catadioptric objective part, the second objective part includes the pupil mirror, and the third objective part is a refractive objective part.

8. The system according to claim 1, wherein the first objective part is a purely refractive objective part, the second objective part is a catadioptric objective part, and the third objective part is a purely refractive objective part.

9. The system according to claim 1, wherein the catadioptric projection objective further comprises:
   a first deflecting mirror arranged to deflect radiation from the object surface towards the pupil mirror or to deflect radiation from the pupil mirror towards the image surface such that a double pass region where radiation passes at least twice in opposite directions is formed geometrically between the first deflecting mirror and the pupil mirror.

10. The system according to claim 9, wherein the catadioptric projection objective further comprises a second deflecting mirror arranged at 90° to the first deflecting mirror such that the object surface and the image surface are parallel.

11. The system according to claim 10, wherein the first deflecting mirror is arranged to deflect radiation coming from the object surface in the direction of the pupil mirror and the second folding mirror is arranged to deflect radiation coming from the pupil mirror in the direction of the image plane.

12. The system according to claim 10, wherein the first deflecting mirror is arranged optically downstream of the pupil mirror to deflect radiation reflected by the pupil mirror towards the second deflecting mirror, and the second deflecting mirror is arranged to deflect radiation from the first deflecting mirror towards the image surface.

13. The system according to claim 1, wherein all optical elements of the catadioptric projection objective are aligned along an optical axis extending between the object surface and the image surface, and the optical axis is a straight optical axis.

14. The system according to claim 13, wherein the optical elements include a mirror group having an object-side mirror group entry for receiving radiation from the object surface and an image-side mirror group exit for exiting radiation emerging from the mirror group exit towards the image surface, wherein the mirror group includes the at least one pupil mirror.

15. The system according to claim 14, wherein the mirror group comprises:
   a first mirror for receiving radiation from the mirror group entry on the first reflecting area;
   a second mirror for receiving radiation reflected from the first mirror on a second reflecting area;
   a third mirror for receiving radiation reflected from the second mirror on a third reflecting area; and
   a fourth mirror for receiving radiation reflected from the third mirror and for reflecting the radiation to the mirror group exit,
   wherein at least two of the first, second, third and fourth mirrors are concave mirrors having a surface of curvature rotationally symmetric to the optical axis.

16. The system according to claim 15, wherein the third mirror is the pupil mirror.

17. The system according to claim 1, wherein all optical elements of the catadioptric projection objective are aligned along an optical axis extending between the object surface and the image surface, the optical axis does not intersect the object field, and the optical axis does not intersect the image field.

18. The system according to claim 1, wherein the first objective part is designed as an enlarging imaging system having magnification ratio $|\beta|>1$.

19. The system according to claim 18, wherein the optical elements arranged between the object surface and the pupil mirror are configured to provide a maximum chief ray angle $CRA_{max}>25°$ at the pupil mirror.

20. The system according to claim 19, wherein the pupil mirror is arranged optically between a first mirror upstream of the pupil mirror and a second mirror downstream of the pupil mirror, where a chief ray height is $CRH_O$ in the object surface, $CHR_1$ at the first mirror and $CHR_2$ at the second mirror, where the conditions $CRH_1>CRH_O$ and $CRH_2>CRH_O$ are fulfilled.

21. The system according to claim 20, wherein a ratio between a chief ray height at at least one of the mirrors optically upstream or downstream of the pupil mirror and the chief ray height $CRH_O$ in the object surface is at least 1.5.

22. The system according to claim 21, wherein the optical elements arranged between the object surface and the pupil mirror are configured to provide a projection beam at the pupil mirror surface obeying the conditions:

$$|CRH_i|/D_0 <0.1 \quad (1)$$

$$0.9 \leq D_i/D_0 1.1 \quad (2)$$

where $|CRH_i|$ is the amount of a chief ray height of a chief ray of an object field point i at the pupil mirror surface;
   $D_0$ is twice the amount of the marginal ray height at the pupil mirror surface; and
   $D_i=|HRRU_i-HRRL_i|$ is the diameter in the meridional direction of the image of the entrance pupil of the catadioptric projection objective at the pupil mirror surface for a field point i, where $HRR_i$ is the rim ray height of the upper rim ray and $HRRL_i$ is the rim ray height of the lower rim ray corresponding to field point i.

23. The system according to claim 1, wherein the catadioptric projection objective includes at least one further mirror in addition to the pupil mirror operatively connected to the pupil mirror manipulator, wherein the further mirror is operatively connected to a further mirror manipulator configured to vary the shape of a reflective surface of the further mirror.

24. The system according to claim 23, wherein the reflective surface of the further mirror is positioned optically close to a field surface in a region where a marginal ray height is smaller than a chief ray height.

25. The system according to claim 1, wherein the catadioptric projection objective further comprises a negative group having at least one negative lens arranged in front of the pupil mirror on a reflecting side thereof in a double pass region such that radiation passes at least twice in opposite directions through the negative group.

26. The system according to claim 1, wherein one or more transparent optical elements are arranged at or close to at least one of the optically conjugate pupil surfaces in a position where a marginal ray height MRH is greater than the chief ray height CRH such that a ray height ratio RHR=MRH/CRH>1.

27. The system according to claim 26, wherein at least one optical element at or close to an optically conjugate pupil surface is made from an optical material that has a specific heat conductance smaller than the specific heat conductance of calcium fluoride.

28. The system according to claim 27, wherein the at least one optical element at or close to a conjugate pupil surface is made from fused silica.

29. The system according to claim 1, wherein at least 90% of all lenses of the catadioptric projection objective are made from fused silica.

30. The system according to claim 1, wherein all lenses of the catadioptric projection objective are made from fused silica.

31. The system according to claim 1, wherein the catadioptric projection objective is adapted with regard to imaging aberrations to a dry process where the image space between an exit surface of the catadioptric projection objective and the image surface is filled with a gas having refractive index close to 1.

32. The system according to claim 1, wherein the catadioptric projection objective has an image-side numerical aperture NA>0.8.

33. The system according to claim 1, wherein the catadioptric projection objective is designed as an immersion objective adapted with regard to imaging aberrations to a wet process wherein during operation of the catadioptric projection objective an image space between an exit surface of the catadioptric projection objective and the image surface is filled with an immersion medium having refractive index significantly larger than 1.

34. The system according to claim 33, wherein the catadioptric projection objective has an image-side numerical aperture NA>1.0 when used in connection with an immersion medium having refractive index $n_I>1.3$.

35. The system according to claim 34, wherein the catadioptric projection objective has an image-side numerical aperture NA>1.35.

36. The system according to claim 1, wherein at least one optical element of the catadioptric projection objective is a high-index optical element made from a high-index material with a refractive index $n \geq 1.6$ at an operating wavelength of the catadioptric projection objective.

37. The system according to claim 36, wherein the high index material is selected from a group consisting of sapphire ($Al_2O_3$), lutetium aluminum garnet (LuAG), barium fluoride ($BaF_2$), lithium fluoride (LiF) and barium lithium fluoride ($BaLiF_3$).

38. The system according to claim 1, wherein the catadioptric projection objective has a last optical element closest to the image surface, wherein an exit surface of the last optical element is immediately adjacent to the image surface and forms the exit surface of the catadioptric projection objective, and wherein the last optical element is at least partly made of a high-index material with refractive index n>1.6 at an operating wavelength of the catadioptric projection objective.

39. The system according to claim 38, wherein the last optical element is a plano-convex lens having curved entry surface and a planar exit surface immediately adjacent to the image surface.

40. A projection exposure apparatus, comprising:
   a light source configured to generate primary radiation during operation of the projection exposure apparatus;
   an illumination system configured to generate illumination radiation from the primary radiation and to illuminate a mask bearing a pattern with the illumination radiation; and
   a system according to claim 1, wherein the catadioptric projection objective is arranged to project an image of the pattern onto a radiation-sensitive substrate.

41. The projection exposure apparatus according to claim 40,
   wherein the control system comprises a control circuit configured so that during operation of the projection exposure apparatus the control circuit receives at least one input signal indicative of at least one status parameter of the catadioptric projection objective or another part of the projection exposure apparatus and outputs to the pupil mirror manipulator a control signal representing an adjustment of the surface shape of the pupil mirror to adapt imaging characteristics of the catadioptric projection objective in response to the input signal.

42. The projection exposure apparatus according to claim 41, wherein the control circuit comprises at least one feedback circuit comprising at least one first sensor configured so that during operation of the projection exposure apparatus the first sensor detects the surface shape of the reflective surface of the pupil mirror or a property of the catadioptric projection objective correlated to the surface shape, where the first sensor is connected to the pupil mirror control unit to provide a feedback signal, and the pupil mirror control unit is configured to optionally modify the control signal controlling the pupil mirror manipulator in response to the feedback signal.

43. The projection exposure apparatus according to claim 41, further comprising a measuring system configured so that during operation of the projection exposure apparatus the measuring system measures the optical performance of the catadioptric projection objective and generates input signals indicative of the level of aberrations present in at least one of a wavefront incident on the image surface and a wavefront in a pupil surface.

44. The projection exposure apparatus according to claim 41, further comprising a measuring system configured so that during operation of the projection exposure apparatus the measuring system measures the surface shape of the pupil mirror surface and generates input signals indicative of the surface shape of the pupil mirror surface.

45. The projection exposure apparatus according to claim 41, further comprising a measuring system configured so that during operation of the projection exposure apparatus the measuring system measures the optical performance of the catadioptric projection objective and generates input signals indicative of an intensity distribution in a pupil surface.

46. The projection exposure apparatus according to claim 40, wherein the memory storing data further represents parameters of a simulation model of the projection exposure apparatus including the catadioptric projection objective.

47. The projection exposure apparatus according to claim 46, wherein the catadioptric projection objective comprises at least one sensor configured so that during operation the sensor detects at least one parameter on the status of the catadioptric projection objective and the projection exposure apparatus is configured to derive at least one observable parameter corresponding to a parameter of the simulation model based on the at least one parameter.

48. The projection exposure apparatus according to claim 46, wherein the memory stores at least one data selected from the group consisting of:
temperature data representing temperature of one of more component;
temperature distribution data representing spatial temperature distribution on one or more components;
position data representing at least one of axial position of one or more components, decentering or tilt of one or more components;
shape data representing the shape of the reflective surface of a pupil mirror;
aperture data representing an aperture stop condition;
setting data representing an illumination setting;
radiation power data representing power of the radiation source;
aberration data representing spatial distribution of one or more aberrations in the image field or in a pupil surface of the catadioptric projection objective;
immersion data representing at least one property of an immersion medium including data indicating the presence or absence of an immersion medium; and
pattern data representing information on a type of pattern provided by a mask or another patterning means.

49. The projection exposure apparatus according to claim 46, wherein the control system is configured so that during operation the control system performs a predictive control of the projection exposure apparatus.

50. The projection exposure apparatus according to claim 40, wherein the pupil mirror control unit is configured so that during operation the pupil mirror control unit receives signals from the illumination system indicative of the illumination setting used in an exposure and the control system is configured so that during operation the pupil mirror control unit adjusts the pupil mirror surface in correspondence with the selected illumination mode.

51. The projection exposure apparatus according claim 40, wherein the illumination system is configured so that during operation the illumination system provides at least one polar illumination setting with at least one of two-fold and four-fold radial symmetry around an optical axis; and
the control system is configured to adjust the pupil mirror surface in correspondence with the selected polar illumination substantially with a two-fold or four-fold radial symmetry during operation of the projection exposure apparatus.

52. The projection exposure apparatus according to claim 40, wherein during operation the projection exposure apparatus further comprises:
an immersion layer formed by an immersion liquid having a refractive index $n_I$ substantially larger than 1 arranged between an exit surface of the catadioptric projection objective and a substrate having a substrate surface placed in the image surface of the catadioptric projection objective, and wherein
the pupil mirror control unit is configured so that during operation the pupil mirror control unit receives signals indicative of imaging aberrations and conditions influencing imaging aberrations associated with time-dependent variations of optical properties of the projection system including time-dependent changes of optical properties of the immersion layer; and
the control system is configured so that during operation the control system varies the shape of the pupil mirror surface in response to the signals such that a deformation of the shape of the pupil mirror surface compensates at least partly the imaging aberrations caused by the time-dependent variations.

53. The projection exposure apparatus according to claim 52, wherein the control system is configured so that during operation the control system varies the shape of the pupil mirror surface such that field-constant aberration contributions caused by changes of refractive index of the immersion liquid are at least partly compensated.

54. A method of fabricating semiconductor devices and other types of microdevices utilizing a catadioptric projection objective, the method comprising:
providing a system according to claim 1;
placing a mask providing a prescribed pattern in the object surface of the catadioptric projection objective;
illuminating the mask with ultraviolet radiation having a prescribed wavelength;
projecting an image of the pattern onto a photo sensitive substrate; and
adjusting imaging characteristics of the catadioptric projection objective by varying a surface shape of the pupil mirror having a reflective pupil mirror surface positioned close to or at a pupil surface of the catadioptric projection objective.

55. The method according to claim 54, further comprising:
arranging an immersion layer formed by an immersion liquid having a refractive index $n_I$ substantially larger than 1 between an exit surface of the catadioptric projection objective and a surface of the photo sensitive substrate placed in the image surface of the catadioptric projection objective,
wherein the image of the pattern is projected onto the photo sensitive substrate through the immersion layer.

56. The method according to claim 54, wherein the adjusting step is performed during at least one of exposure of the substrate and an exchange of substrates and an exchange between different masks at the location of use of the catadioptric projection objective.

57. The method according to claim 54, further comprising:
detecting one of imaging aberrations and conditions influencing imaging aberrations associated with time-dependent variations of optical properties of the projection system including time-dependent changes of optical properties of the immersion layer;
generating sensing signals associated with the time-dependent changes; and
varying a shape of the pupil mirror surface in response to the sensing signals such that a deformation of the shape of the pupil mirror surface compensates at least partly the imaging aberrations caused by the time-dependent changes.

58. The method according to claim 57, wherein the shape of the pupil mirror surface is varied such that field-constant aberration contributions caused by changes of refractive index of the immersion liquid are at least partly compensated.

59. The method according to claim 54, wherein illuminating the mask with ultraviolet radiation having the prescribed wavelength utilizes an illumination setting provided by an illumination system, and the method further comprises:
adjusting the illumination to provide an off-axis illumination setting where, in a pupil surface of the illumination system and in at least one optically conjugate pupil surface of the catadioptric projection objective, a light intensity in regions outside the optical axis is greater than a light intensity at or near to the optical axis; and
adjusting the imaging characteristics of the catadioptric projection objective by varying the surface shape of the pupil mirror in a manner adapted to the off-axis illumination setting such that wavefront aberrations caused by spatially inhomogeneous radiation loads on optical elements at or near a pupil surface of the catadioptric projection objective are at least partly compensated.

60. The method according to claim 59, wherein the off-axis illumination setting is one of a dipole illumination and a quadrupole illumination.

61. The method according to claim 59, wherein a polar illumination setting is used causing an inhomogeneous radiation load having multi-fold radial symmetry in transparent optical elements close to pupil surfaces, and wherein resulting wavefront deformations having corresponding multi-fold radial symmetry are at least partly compensated for by corresponding deformations of the pupil mirror surface by causing the pupil mirror surface to deform essentially with a multi-fold radial symmetry.

62. The method according to claim 54, wherein the pupil mirror control unit includes or is communicatively connected to a memory storing data representing parameters of a simulation model of at least one of the catadioptric projection objective and of the projection exposure apparatus including the catadioptric projection objective, and wherein the control system derives at least one input signal for a control circuit from the data stored in the memory.

63. The method according to claim 62, wherein a predictive control of the projection exposure apparatus is performed based on the data.

\* \* \* \* \*

UNITED STATES PATENT AND TRADEMARK OFFICE
CERTIFICATE OF CORRECTION

PATENT NO.       : 8,390,784 B2
APPLICATION NO.  : 12/369460
DATED            : March 5, 2013
INVENTOR(S)      : Alexander Epple It is certified that error appears in the above-identified patent and that said Letters Patent is hereby corrected as shown below:

In the Specification

Column 6,
Line 27-28, delete "reference)" and insert --reference).--

Column 10,
Line 59, delete "n=2.14" and insert --$n_I$=2.14--

Column 10,
Line 64, delete "193" and insert --$\lambda$=193--

Column 18,
Line 59, delete "FP 1," and insert --FP1,--

Column 21,
Line 29, delete "n=2.14" and insert --$n_I$=2.14--

Column 21,
Line 30, delete "cyclohexan" and insert --cyclohexane--

Column 28,
Line 28-29, delete "reference" and insert --reference.--

In the Claims

Column 49,
Line 7, delete "$CHR_1$" and insert --$CRH_1$--

Signed and Sealed this
Thirteenth Day of August, 2013

Teresa Stanek Rea
*Acting Director of the United States Patent and Trademark Office*

Column 49,
Line 7, delete "$CHR_2$" and insert --$CRH_2$--

Column 49,
Line 19, delete "$0.9 \leq D_i/D_0 1.1$" and insert --$0.9 \leq D_i/D_0 \leq 1.1$--

Column 50,
Line 31, delete "(LuAG)," and insert --(LuAlG),--

Column 52,
Line 13, delete "according" and insert --according to--